(12) United States Patent
Lee

(10) Patent No.: US 11,435,407 B2
(45) Date of Patent: Sep. 6, 2022

(54) DEVICE AND METHOD FOR ENHANCING ACCURACY OF DETECTING LEAKAGE CURRENT

(71) Applicant: Hyun Chang Lee, Gyeonggi-do (KR)

(72) Inventor: Hyun Chang Lee, Gyeonggi-do (KR)

( * ) Notice: Subject to any disclaimer, the term of this patent is extended or adjusted under 35 U.S.C. 154(b) by 274 days.

(21) Appl. No.: 16/631,047

(22) PCT Filed: Apr. 6, 2018

(86) PCT No.: PCT/KR2018/004066
§ 371 (c)(1),
(2) Date: Jan. 14, 2020

(87) PCT Pub. No.: WO2019/017568
PCT Pub. Date: Jan. 24, 2019

(65) Prior Publication Data
US 2020/0150189 A1 May 14, 2020

(30) Foreign Application Priority Data

Jul. 19, 2017 (KR) .................. 10-2017-0091665
Aug. 1, 2017 (KR) .................. 10-2017-0097857
Mar. 6, 2018 (KR) .................. 10-2018-0026207

(51) Int. Cl.
*G01R 31/50* (2020.01)
*G01R 19/25* (2006.01)
(Continued)

(52) U.S. Cl.
CPC ......... *G01R 31/50* (2020.01); *G01R 19/2509* (2013.01); *G01R 19/2513* (2013.01);
(Continued)

(58) Field of Classification Search
CPC ...... G01R 31/08; G01R 31/083; G01R 31/50; G01R 31/52; G01R 31/58; G01R 19/2509;
(Continued)

(56) References Cited

U.S. PATENT DOCUMENTS 10,996,285 B2 * 5/2021 Lee .................. G01R 31/08
2012/0089266 A1 4/2012 Tomimbang et al.
(Continued)

FOREIGN PATENT DOCUMENTS

JP  2010190645 A  9/2010
KR  100503713 B1  7/2005
(Continued)

*Primary Examiner* — John H Le
(74) *Attorney, Agent, or Firm* — Nicholas Park

(57) ABSTRACT

The device for detecting a leak may include: an earth voltage measuring unit measuring earth voltage; an ADC unit sampling the measured earth voltage and converting the sampled earth voltage into a digital value; an effective value calculating unit calculating an effective value of the earth voltage converted into the digital value; a Fourier transforming unit performing Fourier transform of the measured earth voltage to calculate voltage for each harmonic component; a content rate calculating unit calculating a voltage content rate of the fundamental frequency to voltage; a harmonic distortion rate calculating unit calculating a total harmonic distortion and a harmonic distortion factor based on the voltage for each harmonic component; a zero-crossing estimating unit estimating a zero-crossing count; and a suspicious earth leaking area determining unit determining that the earth voltage is generated by the leak of the AC commercial power.

10 Claims, 36 Drawing Sheets

(51) Int. Cl.
    *G01R 21/133* (2006.01)
    *G01R 23/02* (2006.01)
    *G01R 23/20* (2006.01)
    *G01R 31/08* (2020.01)

(52) U.S. Cl.
    CPC .......... *G01R 21/133* (2013.01); *G01R 23/02* (2013.01); *G01R 23/20* (2013.01); *G01R 31/083* (2013.01)

(58) Field of Classification Search
    CPC .. G01R 19/2513; G01R 21/133; G01R 23/02; G01R 23/16; G01R 23/20
    USPC .......................................................... 702/75
    See application file for complete search history.

(56) References Cited

U.S. PATENT DOCUMENTS

2016/0124038 A1  5/2016  Matsushita et al.
2016/0299183 A1  10/2016  Lee

FOREIGN PATENT DOCUMENTS

| | | |
|---|---|---|
| KR | 1020150059103 A | 5/2015 |
| KR | 1020150131395 A | 11/2015 |
| KR | 1020170007696 A | 1/2017 |

\* cited by examiner

DEVICE AND METHOD FOR ENHANCING ACCURACY OF DETECTING LEAKAGE CURRENT

TECHNICAL FIELD

The present disclosure relates to an electric power field, and more particularly, to a device and a method for improving the accuracy of earth leakage detection.

BACKGROUND ART

A device and a method for determining whether the occurrence of earth leakage and locating an earth leaking point in a multi-common grounding environment by a ground fault (earth leakage) of a power line buried in the ground have been disclosed.

There are Korean Patent No. 10-1559533 disclosing "Mobile Apparatus and Method For Locating Earth Leaking Point", Korean Patent Publication No. 10-2017-0007696 disclosing "The apparatus and method to locate the leaking point efficiently under TN-C environment", and as a non-patent document, new power technology No. 104 disclosing "Low Voltage Line Path and Leak Detection Technology in Neutral Line Common Grounding Environment".

DISCLOSURE

Technical Problem

Electric power companies are required to ground a neutral point of the power source (transformer) to the earth to detect a defect that is caused by a ground fault (electrical leakage) which accounts for most of the power equipment failure and leaks out a dangerous voltage from inside through an insulation degraded point to the surrounding soil (earth). In the event of a ground fault, a returning fault current from the earth to the grounded neutral point of the power source (transformer) is continuously monitored to detect the occurrence of a ground fault, and further action to clear the cause of the fault. In other words, the non-faulty return current of unbalanced load returns to the neutral point of power source (transformer) through a neutral line, while the ground fault (earth leak) current returns through the earth, respectively.

However, when the earth leakage fault is located at a distance far from the power source (transformer), earth resistance increases to block the fault (leak) current from reaching the grounded neutral point of the power source. And as a result, it is impossible to detect the leak fault at a power source, and the power is continuously supplied without any protective measures so that a risk of an electric shock accident may increase.

In order to prevent the risk of the electric shock by earth resistance according to the distance between the power source and the earth leaking point, a multi-common grounding method (MEN, Multiple Earthed Neutral) is introduced, which grounds a neutral line at various points in the middle of a power line according to the regulations such as IEC60364. Previously only one point of the power source (transformer) is grounded but now multiple locations of the power line (neutral line) which one grounded point of the power source is extended are grounded to the earth and the return distance of fault (leak) current is shortened to minimize an influence by the earth resistance, thereby preventing the electric shock accident.

However, if the neutral line is grounded at multiple locations configured as MEN in the power system, a closed circuit (ground loop) is formed between the neutral groundings, and both return currents regardless of its origin, non-fault (unbalanced load) or fault, can flow either path freely and circulate in the loop. The mixed circulating current can cause the malfunction when identifying the fault current and locating the suspicious earth leaking area by measuring the vector sum of the current flowing in the power line In order to solve such a problem, in the related art, the conventional technique detects whether an occurrence of earth leaking and locates a suspicious earth leaking area as depicted in FIG. 1 by measuring the earth potential rather than measuring the returning or the vector summing current to determine a suspicious earth leaking area at the location of earth potential raised by the earth leaking and then determines the location of the earth leaking point by detecting an exploration signal after injecting the signal into the power cable in a suspicious area.

FIG. 1 is a flowchart of the task of locating an earth leakage point by measuring an earth voltage used in the related art. The task includes acquiring a ground voltage (V1) by measuring the earth potential between a ground point and another ground point or a neutral line (not illustrated) that is connected to the ground point in adjacent customer premises and then analyzing the V1 to determine a suspicious earth leaking area where the V1 has voltage level more than threshold (103), the content rate which is indicating the ratio of the power frequency component (VF) equal or more a certain level and the variation rate of V1 is within a specific range while the internal resistance changes (105). And locating an earth leaking point in the suspicious earth leaking area (106) by connecting a leak exploration signal generating device to a power line in the suspicious earth leaking area (107), moving along a buried path of the power line (108 and 109), and detecting the exploration signal from the earth surface (113) injected by the exploration signal generating device by using a leak detection device (110, 111, and 112).

FIG. 2 illustrates a front end circuit and an internal algorithm configuration of a leak detecting device for executing two separate tasks depicted in FIG. 1. To find a suspicious earth leaking area 102, an earth voltage (V1,122) and power frequency (50 or 60 Hz) voltage (Vf) of input impedance 119 between an earth leaking predicted point 117 and remote ground 118 or between neutral line of customer premises which is near earth leaking predicted point 117 and a remote ground 118 is measured and then the content ratio may be obtained by applying the ratio of the earth voltage (V1) and the power frequency (50 or 60 Hz) voltage (Vf) to [Equation 1]. Also, the variation rate may be calculated by varying the input impedance 119 of the measuring circuit and applying the measured voltage magnitude to [Equation 2].

Content rate=60 Hz component voltage/total earth voltage*100    [Equation 1]

Variation rate=(voltage at maximum resistance)−(voltage at minimum resistance)/voltage at minimum resistance*100    [Equation 2]

When it is found that the place is the suspected earth leaking area based on the content rate and the rate of change, it is possible to perform an earth leak point detection work to determine the location of an earth leaking point in the area.

FIG. 3 shows a configuration of a device for detecting a leak point in the suspicious earth leaking area. A leak detecting apparatus 1000 proceeds along a buried path of a power line 202 and 203 in the suspicious earth leaking area by obtaining a radiated electromagnetic pulse signal 111 and 112 when a current pulse signal transmitted by a leak exploration signal generating apparatuses 302, 303 flows through the power line 202, 203, measures an earth voltage 212 by contacting the land surface 105, 106 of the buried path. Further, the leak detecting apparatus 1000 detects a voltage pulse signal 110 included in the earth voltage 211 from the earth at a signal generation time notified by the magnetic field pulse signals 111 and 112. The voltage pulse signal 110 is designed to generate a next signal 110 at a predetermined interval from the time at which the magnetic field pulse signals 111 and 112 are received so that the leak detecting device 1000 detects a signal included in the earth voltage at a generation time of the next signal 110 and determines a maximum point of the signal as the leak point 128.

As described above, a technique has been used in the field to detect a leak voltage pulse signal 140 contained in the earth voltage on the ground surface within the suspicious earth leaking area and determine the location of leak source regardless of whether the neutral line is grounded in multiple or single location(s). But as illustrated in FIG. 4, a magnetic field generated due to alternating current 153 flowing on an electric wire 151 corresponds to magnetic field induction 155 formed by an adjacent conductor 152 to cause a magnetic field coupling 154 phenomenon. Further, the electric wire 151 causes the electrostatic coupling 157 by an electrostatic induction 158 phenomenon of the adjacent conductor 152. That is, when the earth potential is raised by induced voltage generated by the magnetic field coupling 154 and the electrostatic coupling 157 and/or stray voltage generated when unbalanced load return current which flows on a multi-ground neutral line flows out to the earth through a ground point, an error that the case is determined as if the actual leak occurrence as illustrated in FIG. 5.

In the related art, in order to distinguish between an actual leak in which risk voltage flows out to the ground due to an insulation failure of a power facility transmitting or storing AC commercial power and a rise in earth potential due to the induced voltage or the stray voltage which is parasitic around the power line, the actual leak and the rise in earth potential are intended to be distinguished by measuring the content rate and the voltage variation rate in the earth voltage (V1), but when this is applied in the field, the actual leak and the rise in earth potential cannot be accurately distinguished, and an error in which the location of the parasitic voltage source around the power line is detected as the location of actual leak occurs as in FIG. 5.

In order to solve the problem mentioned above, it is necessary to propose a method and a device for correctly distinguishing the actual leak source and the earth potential rise by the induced or stray voltage source, which is continuously parasitic around the power line.

Technical Solution

An embodiment of the present disclosure provides a device for detecting an earth leakage. The device for detecting an earth leakage may include: an earth voltage measuring unit measuring earth voltage; an ADC unit sampling the measured earth voltage and converting the sampled earth voltage into a digital value; an effective value calculating unit calculating an effective value of the earth voltage converted into the digital value; a Fourier transforming unit performing Fourier transform of the measured earth voltage to calculate a voltage for each harmonic component which is an integer multiple of a fundamental frequency—a utility frequency of AC commercial power—, based on the effective value of the earth voltage; a content rate calculating unit calculating a voltage content rate of the fundamental frequency to the voltage obtained by adding the voltage for each harmonic component based on the voltage for each harmonic component; a harmonic distortion rate calculating unit calculating a total harmonic distortion and a harmonic distortion factor based on the voltage for each harmonic component; a zero-crossing estimating unit estimating a zero-crossing count at which the earth voltage converted into the digital value passes through zero voltage for a predetermined time T1; and a suspicious earth leaking area determining unit determining a suspicious earth leaking area where the earth voltage is generated by the leak of the AC commercial power based on at least any one of the effective value of the earth voltage, the voltage content rate, the total harmonic distortion, the harmonic distortion factor, and the zero-crossing count.

The predetermined time T1 may be a time which is a predetermined integer multiple of a cycle of the AC commercial power.

In addition, the device may further include a distortion estimating unit estimating the distortion count which is the number of times the distortion by the harmonics occurs in the measured earth voltage for the predetermined time T1 and the suspicious earth leaking area determining unit may determine the suspicious earth leaking area based on at least any one of the effective value of the earth voltage, the voltage content rate, the total harmonic distortion, the harmonic distortion factor, the zero-crossing count, and the distortion count.

The distortion estimating unit may detect the first polarity of change by comparing a digital value of the first earth voltage converted through sampling and a digital value of the second earth voltage converted through a next sampling period. In the same manner, the distortion estimating unit detects the second polarity of change by comparing a digital value of the second earth voltage converted through sampling and a digital value of the third earth voltage converted through a succeeding sampling period. When the distortion estimating unit finds that the first polarity and the second polarity are changed, the distortion estimating unit may determine that the distortion by the harmonics occurs and increase the distortion count.

Further, the earth voltage measuring unit may include an electrode connected with a predetermined measurement point "a" on a ground surface, an electrode connected with a predetermined measurement point "b" differs from the point "a" on the ground surface, a resistance array connected in parallel between the measurement point "a" and "b", and a measuring unit which measures a voltage between both ends of the resistance array.

In addition, the zero-crossing estimating unit may count the number of zero-crossings that cross the zero voltage at the same time the polarity of the earth voltage is changed during the predetermined time T1.

Moreover, the suspicious earth leaking area determining unit may determine that the earth voltage is generated by the leak of the AC commercial power when the effective value of the earth voltage exceeds a predetermined threshold voltage value, the voltage content rate exceeds a predetermined voltage content rate, the total harmonic distortion is less than a predetermined total harmonic distortion, the harmonic distortion factor is less than a predetermined harmonic distortion factor, and the zero-crossing counts coincides with a predetermined count.

In addition, the suspicious earth leaking area determining unit may determine that the earth voltage is generated by the leak of the AC commercial power when the effective value of the earth voltage exceeds a predetermined threshold voltage value, the voltage content rate exceeds a predetermined voltage content rate, the total harmonic distortion is less than a predetermined total harmonic distortion, the harmonic distortion factor is less than a predetermined harmonic distortion factor, the zero-crossing count coincides with a predetermined count, and the distortion count is less than a predetermined count.

Further, the device for detecting an earth leakage may further include: a magnetic field signal receiving unit receiving a magnetic field signal generated from an exploration current generating device; a leak detection voltage signal receiving unit receiving a leak detection voltage signal generated from a leak detection voltage signal generating device; a power line buried path search unit searching a path of a power line buried in the suspicious earth leaking area based on the magnetic field signal; and a leak point determining unit determining a leak point of the buried power line based on the leak detection voltage signal.

The leak point determining unit may set a logical value according to whether or not a leak detection voltage signal is received, and the point at which the magnitude of the detection voltage signal has the maximum value can be determined as the leakage current point when all the logic value match the logic value of the leakage detection voltage signal generated by the leakage detection voltage signal generator.

Another embodiment of the present disclosure provides a method for detecting a leak. The method for detecting leak may include: measuring earth voltage; sampling the measured earth voltage and converting the sampled earth voltage into a digital value; calculating an effective value of the earth voltage converted into the digital value; performing Fourier transform of the measured earth voltage to calculate voltage for each harmonic component which is an integer multiple of a fundamental frequency—a power frequency of AC commercial power—, based on the effective value of the earth voltage; calculating a voltage content rate of the fundamental frequency to voltage obtained by adding the voltage for each harmonic component based on the voltage for each harmonic component; calculating a total harmonic distortion and a harmonic distortion factor based on the voltage value for each harmonic component; estimating a zero-crossing count at which the earth voltage converted into the digital value passes through zero voltage for a predetermined time T1; and determining that the earth voltage is generated by the leak of the AC commercial power based on at least any one of the effective value of the earth voltage, the voltage content rate, the total harmonic distortion, the harmonic distortion factor, and the zero-crossing count, and determining a region where the earth voltage is measured as the suspicious earth leaking area based on the determination result.

Advantageous Effects

According to one embodiment of the present disclosure, any ground voltages (leakage voltages) caused either by parasitic voltages existing around commercial power equipment or insulation failures that may cause an accident of human life and equipment may be distinguished regardless of the configuration of the neutral grounding system. It is possible to prevent the electric shock by improving the accuracy of earth leakage detection by suggesting the means and method to identify and distinguish the cause of the earth potential rise.

Besides, other features and advantages of the present disclosure may be newly determined through embodiments described below with reference to the present disclosure.

DETAILED DESCRIPTION

Figure 1:
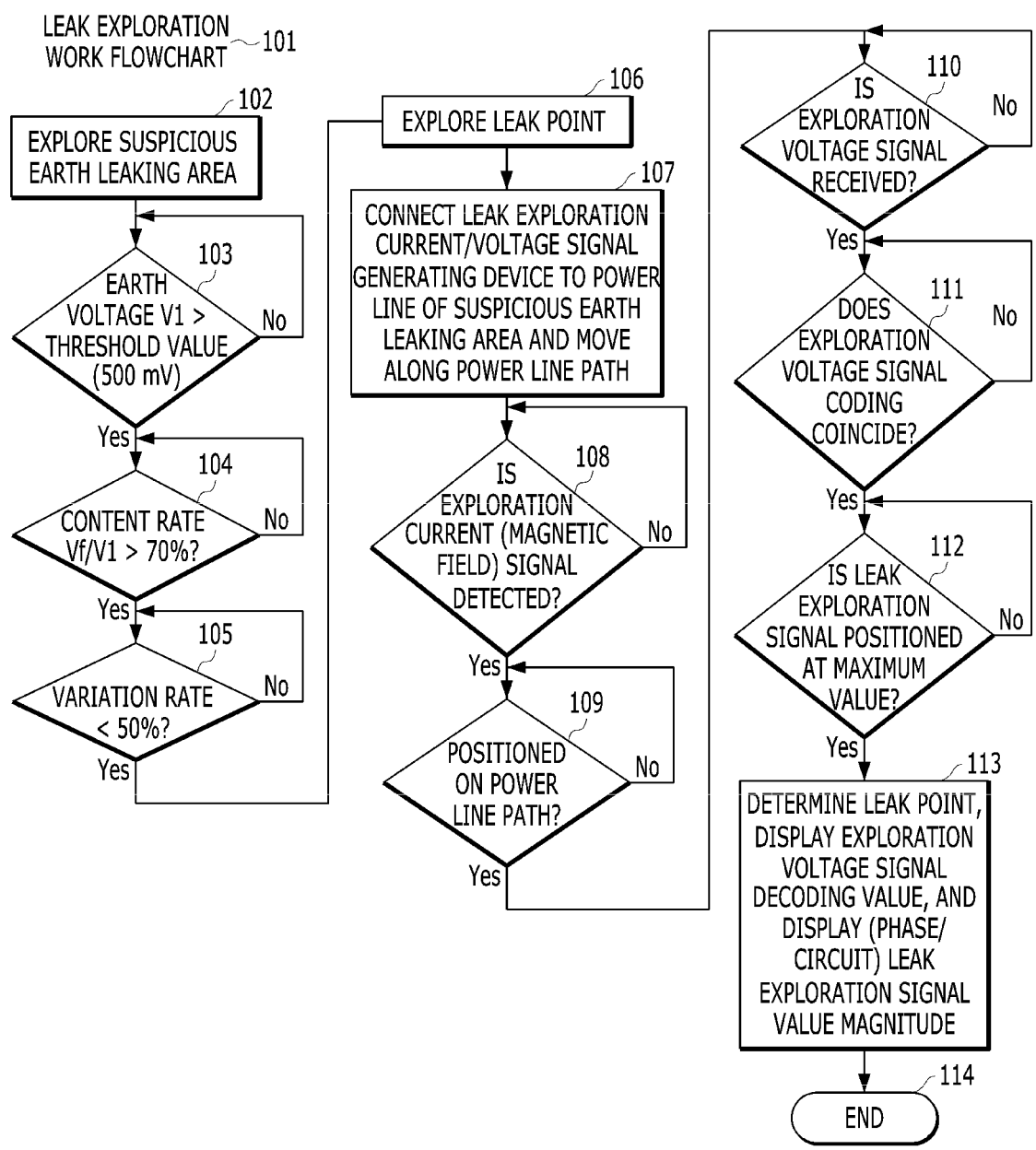
FIG. 1 is a workflow diagram for leak detection in the related art.

Various embodiments will now be described with reference to drawings and like reference numerals are used to refer to like elements throughout all drawings. In the present specification, various descriptions are presented to provide an appreciation of the present disclosure. However, the embodiments can be executed without a specific description. In other examples, known structures and devices are presented in a block diagram form in order to facilitate the description of the embodiments.

"Component", "module", "system", and the like which are terms used in the specification refer to a computer-related entity, hardware, firmware, software, and a combination of the software and the hardware, or execution of the software. For example, the component may be a processing process executed on a processor, the processor, an object, an execution thread, a program, and/or a computer, but is not limited thereto. For example, both an application executed in a computing device and the computing device may be the components. One or more components may reside in the processor and/or the execution thread, and one component may be localized in one computer or distributed among two or more computers. Further, the components may be executed by various computer-readable media having various data structures, which are stored therein. The components may perform communication with another system through local and/or remote processing according to a signal (for example, data from one component that interacts with other components and/or data from other systems through a network such as the Internet through a signal in a local system and a distribution system) having one or more data packets, for example.

The description of the presented embodiments is provided so that those skilled in the art of the present disclosure use or implement the present disclosure. Various modifications of the embodiments will be apparent to those skilled in the art, and general principles defined herein can be applied to other embodiments without departing from the scope of the present disclosure. Therefore, the present disclosure is not limited to the embodiments presented herein but should be analyzed within the widest range, which is consistent with the principles and new features presented herein.

The terms "current pulse generating device" and "exploration current generating device" used in the specification may be often used to be exchanged with each other. The terms "voltage pulse generating device" and "leak detection voltage signal generating device" used in the specification may be often used to be exchanged with each other.

The present disclosure relates to a device and a method for providing information on a suspicious earth leaking area and a leak source to limit an exploration area effectively under the environment where in the middle of a power cable have several PENs (Protective Earthed Neutral) that ground a neutral line at different locations such as MEN (Multiple Earthed Neutral) configuration.

Figure 6:
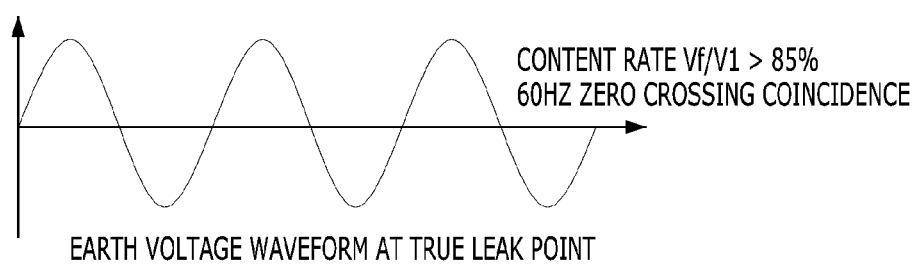
FIG. 6 illustrates an actual example of an earth voltage waveform at a place where the true leak occurs.
Figure 7:
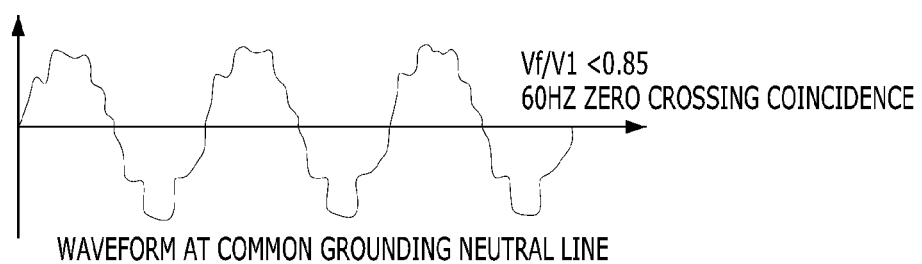
FIG. 7 illustrates an actual example of a waveform of earth voltage, which rises by power line parasitic voltage.
Figure 8:
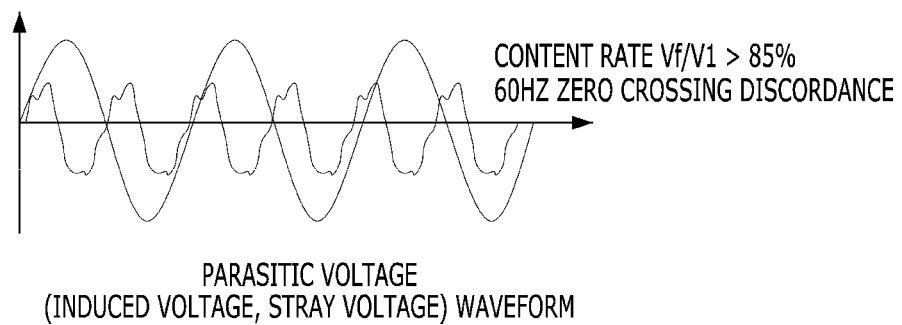
FIG. 8 illustrates an actual example of the waveform of the earth voltage, which rises by the power line parasitic voltage.

In order to distinguish actual leak voltage from a parasitic voltage source which continuously exists in proximity to a power facility charged with a commercial power source, as a result of measuring the waveforms, an induced voltage of conductors electrostatically or magnetically coupled to the power lines or a stray voltage generated by the current flows in the ground out from a neutral line are illustrated in FIG. 7 or 8. In other words, a waveform of earth voltage of which potential rises at a true leak location of the commercial power which flows out to the ground due to an insulation failure of the power facility has a pure sine waveform contains a power frequency illustrated in FIG. 6. On the other hand, a parasitic voltage waveform has multiple components of different phases and magnitudes are synthesized together.

Figure 3:
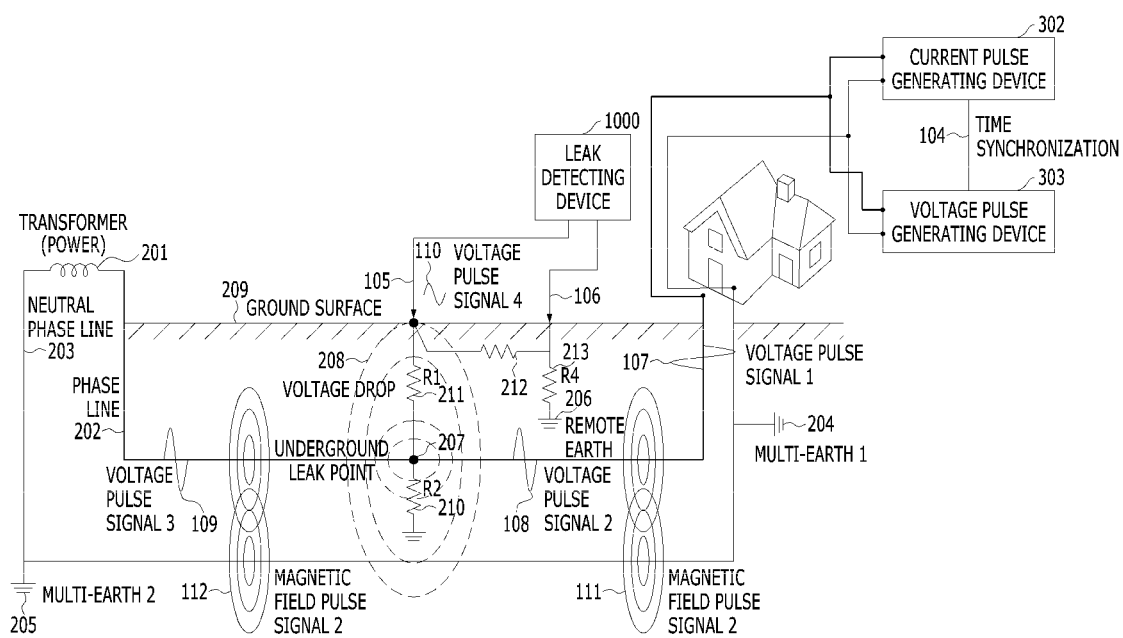
FIG. 3 is an installation configuration diagram of a leak exploration signal device for exploring a leak point and the leak detecting device.
Figure 4:
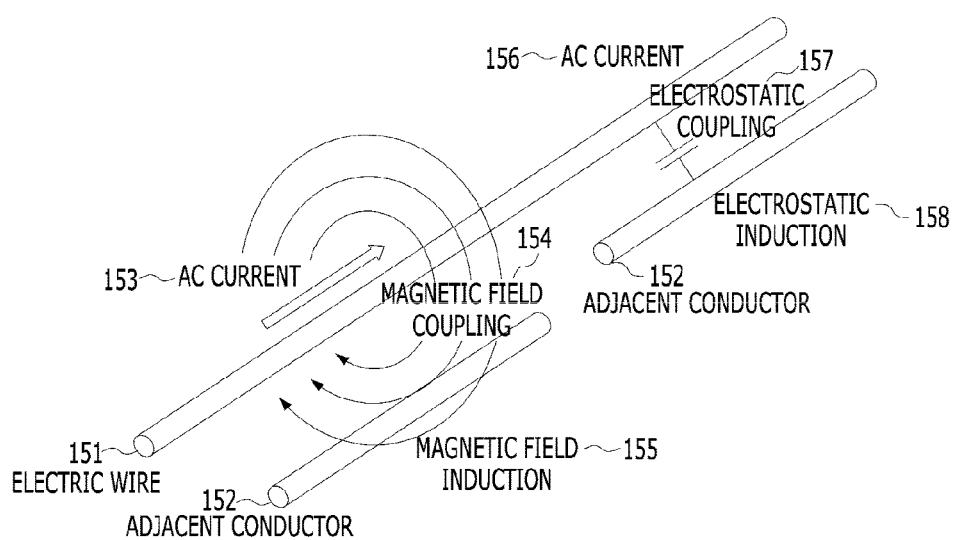
FIG. 4 illustrates the generation of induced voltage by a power line, and electrostatic and magnetic field coupling.
Figure 5:
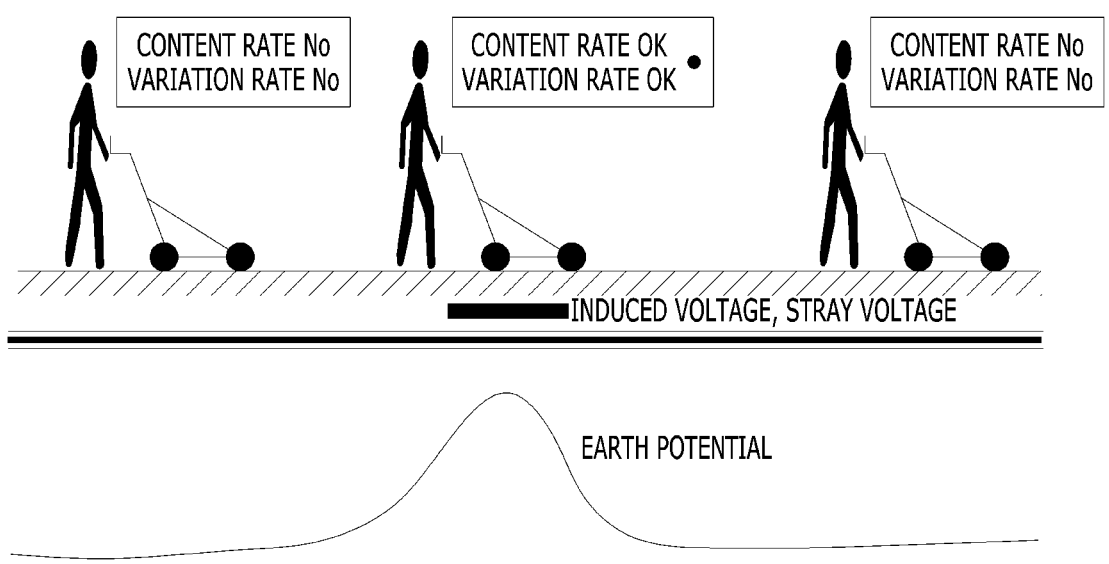
FIG. 5 describes that in the related art, rising of an earth potential is mistaken as the true leak by parasitic voltage (induced and stray voltage) around the power line.

As illustrated in FIG. 3, the AC commercial power has relatively high internal impedance at a ground leak point 207, so even though a voltage drop occurs through R1 until reaching a ground surface, but the earth voltage at a measurement point has a sine wave characteristic of a single pure power frequency (50 or 60 Hz) characteristic not including external noise or the like as illustrated in FIG. 6.

Figure 2:
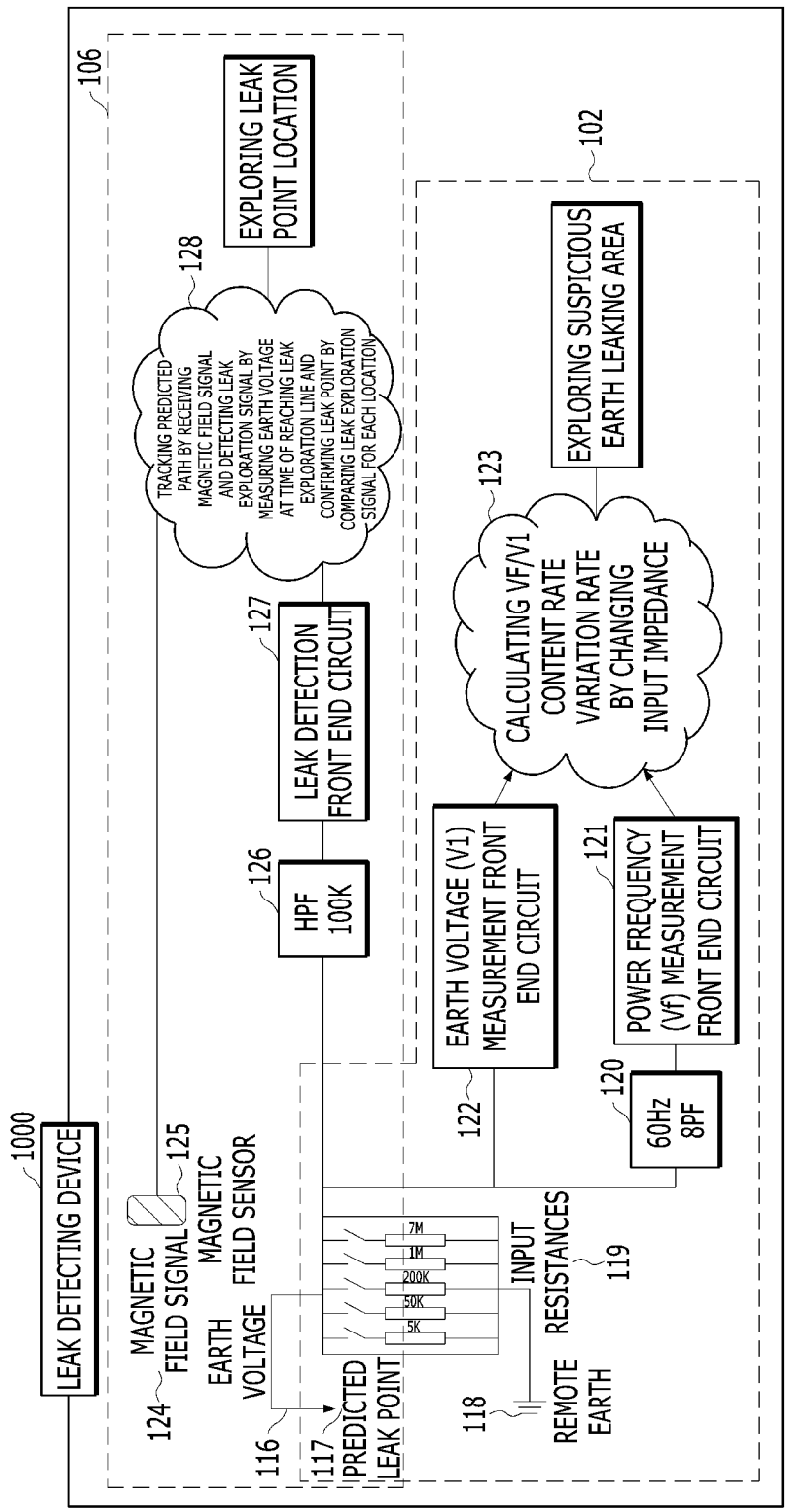
FIG. 2 is an internal configuration diagram of a leak detecting device in the related art.

In view thereof, in the related art, as illustrated in FIG. 2, a content rate which is a ratio a total voltage value (V1) to a voltage value (Vf) of the power frequency (50 or 60 Hz), and a variation rate of voltage are acquired for confirming whether the earth voltage is raised from the actual voltage, however, a portion where the earth voltage rises by the parasitic voltage (induced and stray voltage) may not be distinguished, and as a result, this case is problematic to determine as the true leak mistakenly.

FIG. 7 illustrates an example of a parasitic voltage waveform. Although the parasitic waveform is similar to the power frequency (60 Hz) waveform, the content rate is less than 85%, and the corresponding voltage is found as the parasitic voltage. As a result, there is no problem, but in FIG. 8, even though the parasitic voltage is not a pure waveform, but a distorted, the content rate is maintained to be 85% or more, and this case may be mistaken as the true leak.

Figure 9:
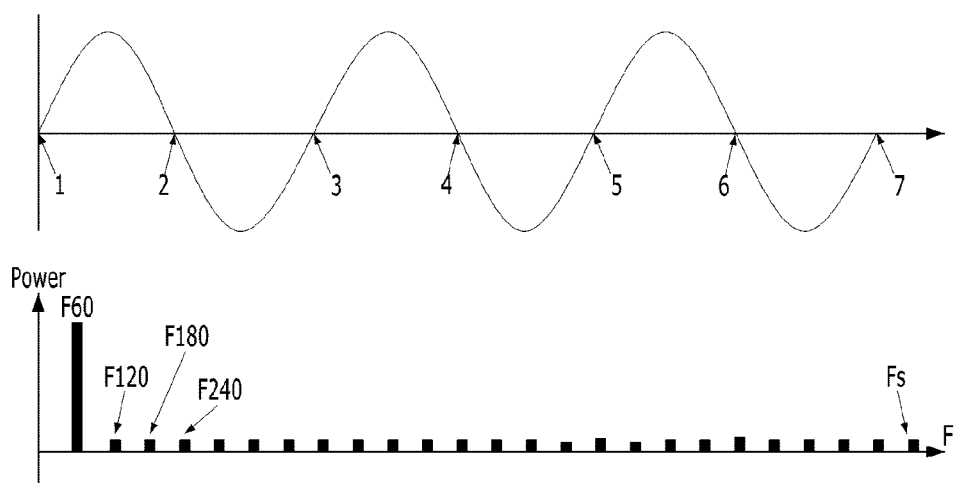
FIG. 9 is a spectrum for each waveform of earth voltage, which rises by the true leak and frequency (harmonic) at the time of Fourier transform.

FIG. 9 exemplifies a method of counting the number of times of zero-crossing of the earth voltage at a location of a leak point in order to distinguish FIG. 8, and a magnitude of a power frequency and a harmonic thereof after Fourier transforms.

Figure 10:
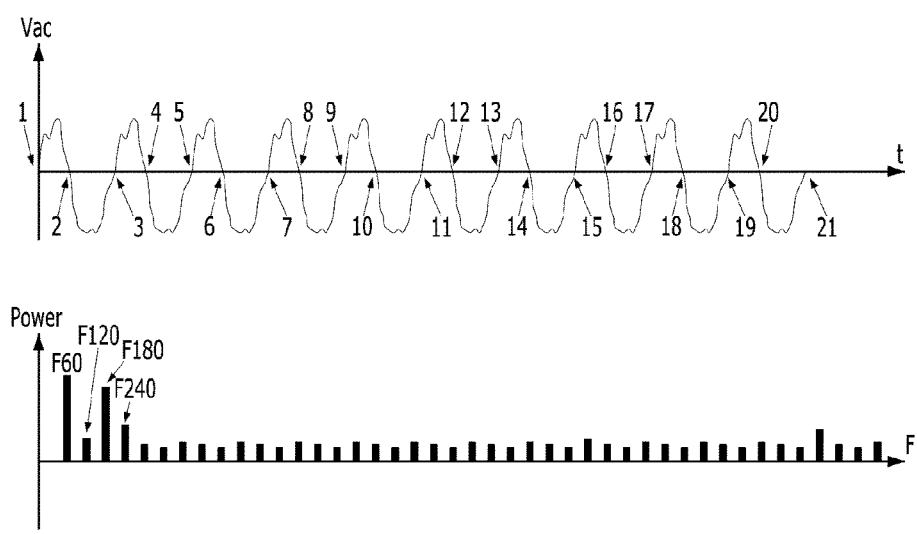
FIG. 10 is a spectrum for each waveform of earth voltage, which rises by the parasitic voltage and frequency (harmonic) at the time of Fourier transform.

FIG. 10 illustrates a method of counting the number of times of zero-crossings of the earth voltage at a buried location of a parasitic voltage source and a magnitude of a power frequency and a harmonic thereof after Fourier transforms in the same manner as FIG. 9.

As illustrated in FIGS. 9 and 10, by counting the number of times of zero-crossing in addition to the content rate of the input earth voltage, even if the parasitic voltage illustrated in FIG. 7 has the content rate of 85% or more, a zero-crossing count (ZCC) is 10 in the true leak when the number of times of zero-crossing is counted for 5 cycles in an actual example, but the parasitic voltage has ZCC which is more than 10 to identify the parasitic input voltage.

As illustrated in FIGS. 9 and 10, by counting the number of zero-crossing in addition to the content rate of the input earth voltage, even if the parasitic voltage illustrated in FIG. 7 has the content rate of 85% or more, a zero-crossing count (ZCC) is 10 in the true leak when the number of zero-crossing is calculated for 5 cycles in an actual example, but the parasitic voltage has ZCC which is more than 10 times, the input signal can be distinguished as parasitic voltage.

Figure 11:
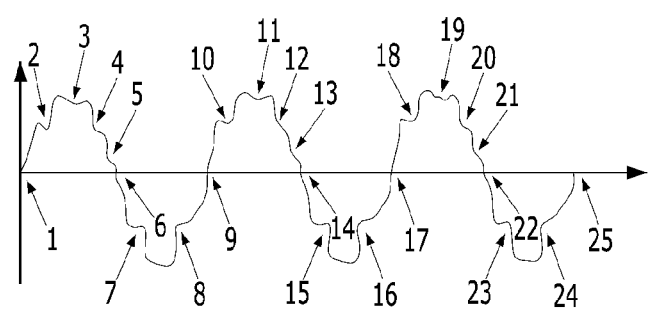
FIG. 11 illustrates the number of times a distortion count is generated in the waveform of the earth voltage, which rises by the parasitic voltage.

FIG. 11 illustrates a distortion count (DC) at a location with a distorted waveform.

Figure 12:
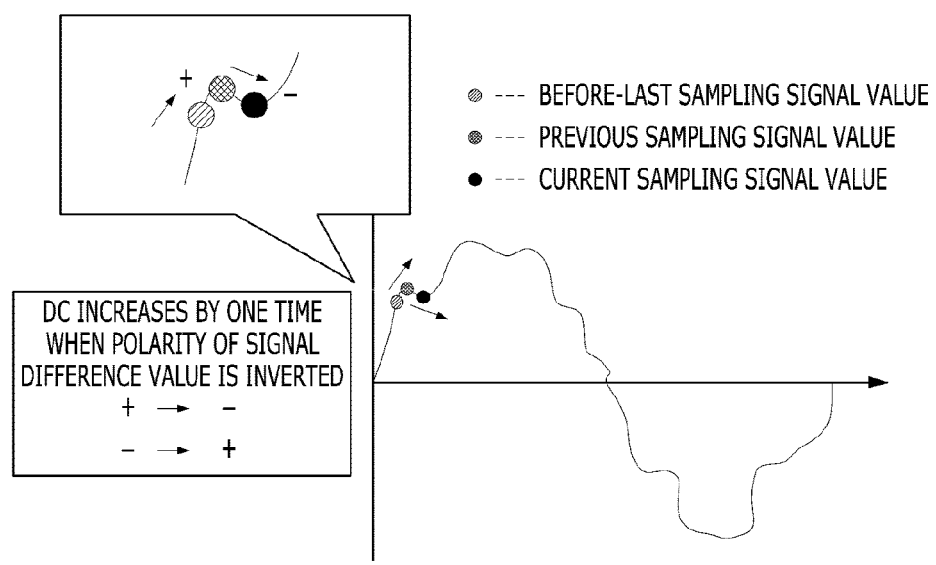
FIG. 12 illustrates a distortion count method in a distorted waveform.
Figure 13:
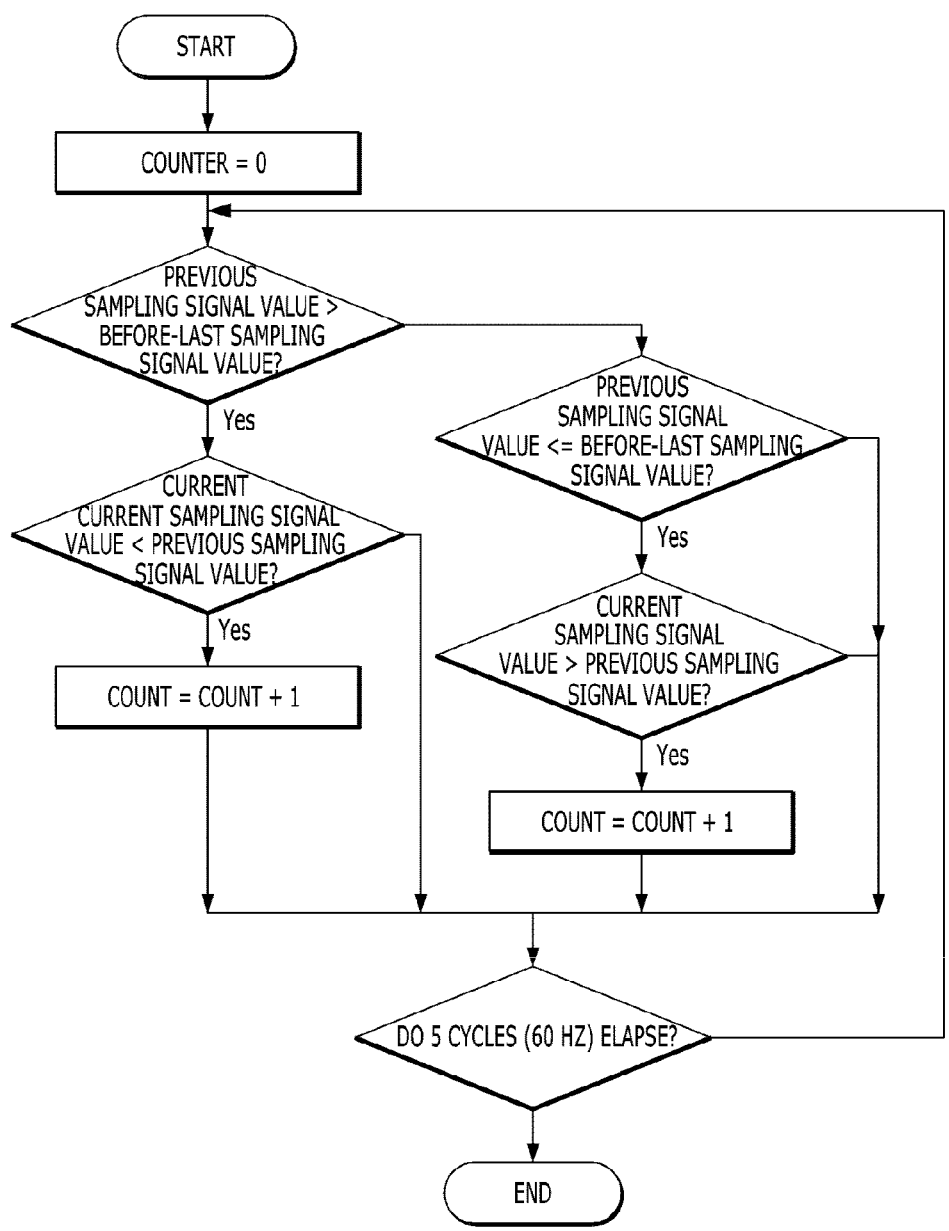
FIG. 13 is a workflow diagram for the distortion count illustrated in FIG. 12.

FIG. 12 illustrates a method for counting the number of locations where distortion occurs as illustrated in FIG. 11. In other words, the comparison between the current signal value and the previous signal value is obtained, and if the polarity is reversed, one count may be added, and FIG. 13 is a flow chart illustrates a DC count workflow for every 5 cycles period of AC commercial voltage. For example, when an immediately previous sampling signal value is higher than a before-last sampling signal value, and a current sampling signal value and the immediately previous sampling signal value are compared, and when the polarity is inverted, one count may be added. Further, when the immediately previous sampling signal value is smaller than the before-last sampling signal value, the immediately previous sampling signal value and the before-last sampling signal value may be compared, and as the comparison result, when the before-last sampling signal value is greater than or equal to the immediately previous sampling signal value, the current sampling signal value and the before-last sampling signal value are compared, and when the current sampling signal value is higher than the immediately previous sampling signal value, it could be determined that the polarity is inverted to be added one count. That is, the polarity is determined by obtaining differences of the before-last, immediately previous, and current sampling signal values to perform the distortion count work for every 5 cycles. The counting workflow is just an example and the present disclosure is not limited thereto.

Figure 28:
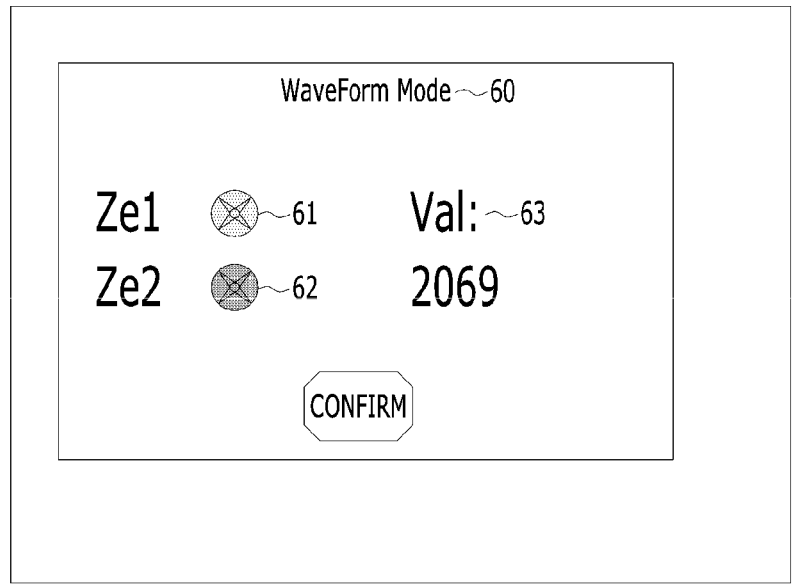
FIG. 28 is an example of a ZCC/DC function selection screen for determining waveform distortion.

As an example, according to the present disclosure, FIG. 28 illustrates a screen 60 in which the ZCC or DC may be selected at the time of determining the distortion of the waveform, and when not ZCC 61 but DC 62 is selected, a size (a size of a sample difference for deciding polarity inversion for counting the DC) of a different value needs to be set at a screen 63. In the example, it can be seen that the size of the sample difference is set to 2069.

Figure 23:
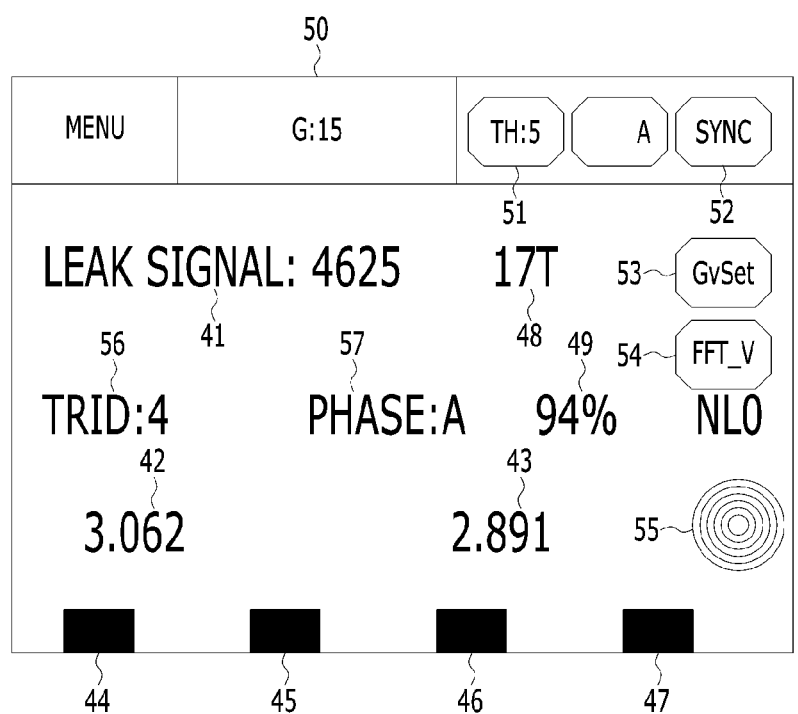
FIG. 23 illustrates an example of a screen displaying a result of transmitting (injecting) the leak exploration signal to the power line in a corresponding area and exploring the leak point after determining an area where the earth potential rises by the true leak in FIG. 20 as the suspicious earth leaking area.
Figure 27:
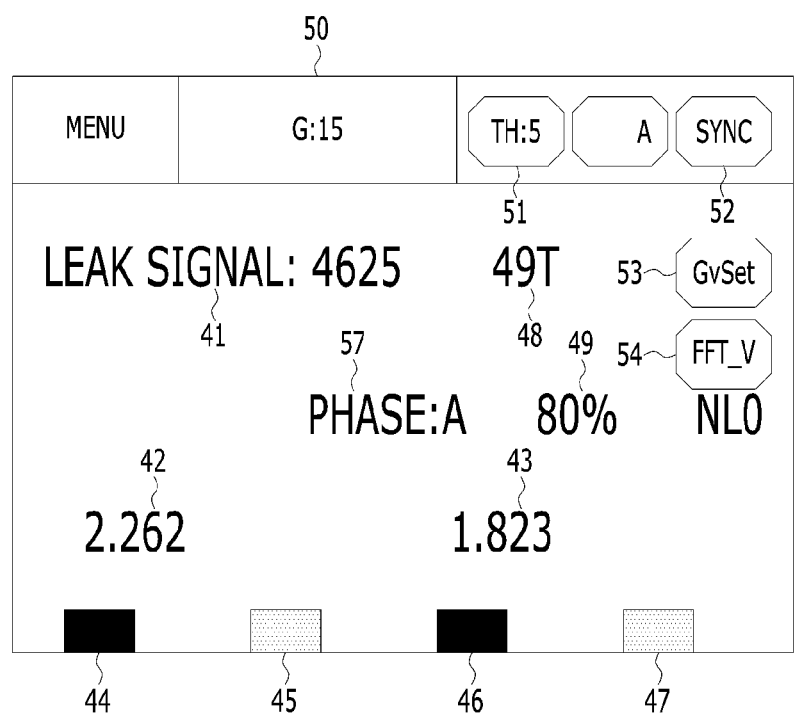
FIG. 27 illustrates an example of a screen displaying a result of transmitting (injecting) the leak exploration signal to the power line and exploring the leak point in order to check whether the portion is misdetermined as a suspicious earth leaking area even though the portion where the earth potential rises by the parasitic voltage is not determined as the suspicious earth leaking area in FIG. 24.

It can be seen that DC count value 48 in FIGS. 23 and 27 is 17 at the true leak location, but 49 at the parasitic voltage location and when the counter number of the DC is ranged 8<DC<28, the corresponding voltage is determined as the true leak voltage and when the DC is out of the range, the corresponding voltage is determined as the parasitic voltage to be disregarded.

As a result of the Fourier transform as illustrated in FIG. 9, the fundamental frequency component of 60 Hz, which is the power frequency, occupies the majority at the true leak point, which is in agreement with the content ratio of 85% or more of the conventional method, but as illustrated in FIG. 10, it can be observed that the fundamental frequency components of 60 Hz decrease in the parasitic voltage, while other harmonic components, including 180 Hz, which is a third harmonic increase.

Consequently, the input earth voltage signal will be Fourier transformed by software rather than hardware filtering to improve the accuracy of the conventional content rate, the threshold values of the THD by harmonics of the fundamental frequency of power systems, and other harmonic frequencies are designated to operate as follows.

Figure 21:
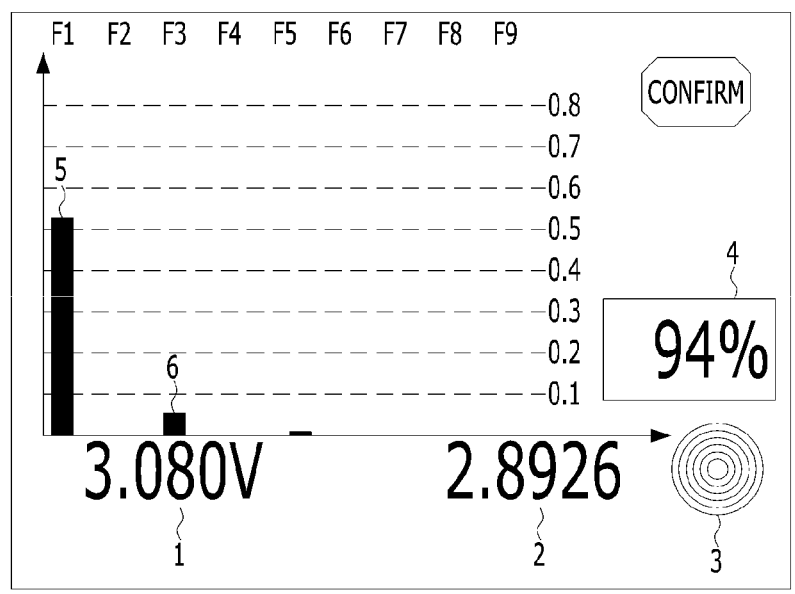
FIG. 21 illustrates an example of a screen displaying a result of Fourier-transform of the earth voltage of which potential rises by the true leak in FIG. 20.
Figure 25:
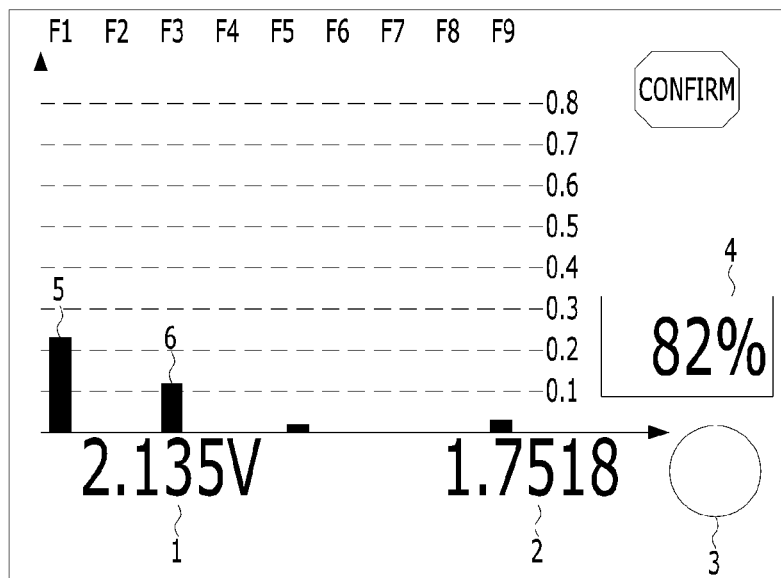
FIG. 25 illustrates an example of a screen displaying a result of Fourier-transform of the earth voltage of which potential rises by the parasitic voltage in FIG. 24.

The following is a measurement table of voltage values of the power frequency and each odd harmonic spectrum voltage value when the true leak voltage and the parasitic voltage of FIGS. 21 and 25 are Fourier-transformed.

TABLE 1

| Frequency spectrum | Voltage value (V) |
|---|---|
| Fundamental frequency (V1) | 2.892 |
| Third harmonic (V3) | 0.114 |
| Fifth harmonic (V5) | 0.034 |
| Seventh harmonic (V7) | 0.017 |
| Ninth harmonic (V9) | 0.016 |
| Total (Vt) | 3.073 |

TABLE 2

| Frequency spectrum | Voltage value (V) |
|---|---|
| Fundamental frequency (V1) | 1.751 |
| Third harmonic (V3) | 0.248 |
| Fifth harmonic (V5) | 0.062 |
| Seventh harmonic (V7) | 0.039 |
| Ninth harmonic (V9) | 0.035 |
| Total (Vt) | 2.135 |

Table 3 shows a result of obtaining a harmonic distortion rate as follows based on the measurement values of Tables 1 and 2 above.

$$THD = \frac{\sqrt{\sum_{n=2}^{Q} V_{2n-1}^2}}{V_1} \quad \text{[Equation 3]}$$

$$THD_{Fn} = \frac{V_n}{V_1} \quad \text{[Equation 4]}$$

TABLE 3

| Classification | True leak voltage | Parasitic voltage | Threshold value | Note |
|---|---|---|---|---|
| Content rate (V1/Vt) | 94.11% | 82.01% | 85.5%> | |
| THD | 4.20% | 14.90% | <10% | |
| THD_F3 | 3.94% | 14.16% | <10% | |
| THD_F5 | 1.17% | 3.54% | <3% | |
| THD_F7 | 0.58% | 2.22% | <2% | |

As shown in Table 3, by setting the content rate and the threshold value for each harmonic, only the earth voltage signal within the threshold value is defined as the true leak voltage to allow this region to be determined as the suspicious earth leaking area where the leak source may exist. The present disclosure is not limited to the method and the device for detecting the leak source location like the example of the present disclosure by measuring the content rate and the THD, the ZCC, or the DC of the power frequency signal (fundamental frequency) included in the signal as described above, but will be able to be used even as a technique that finds an insulation failure location of the power facility even in other diagnostic techniques.

Figure 14:
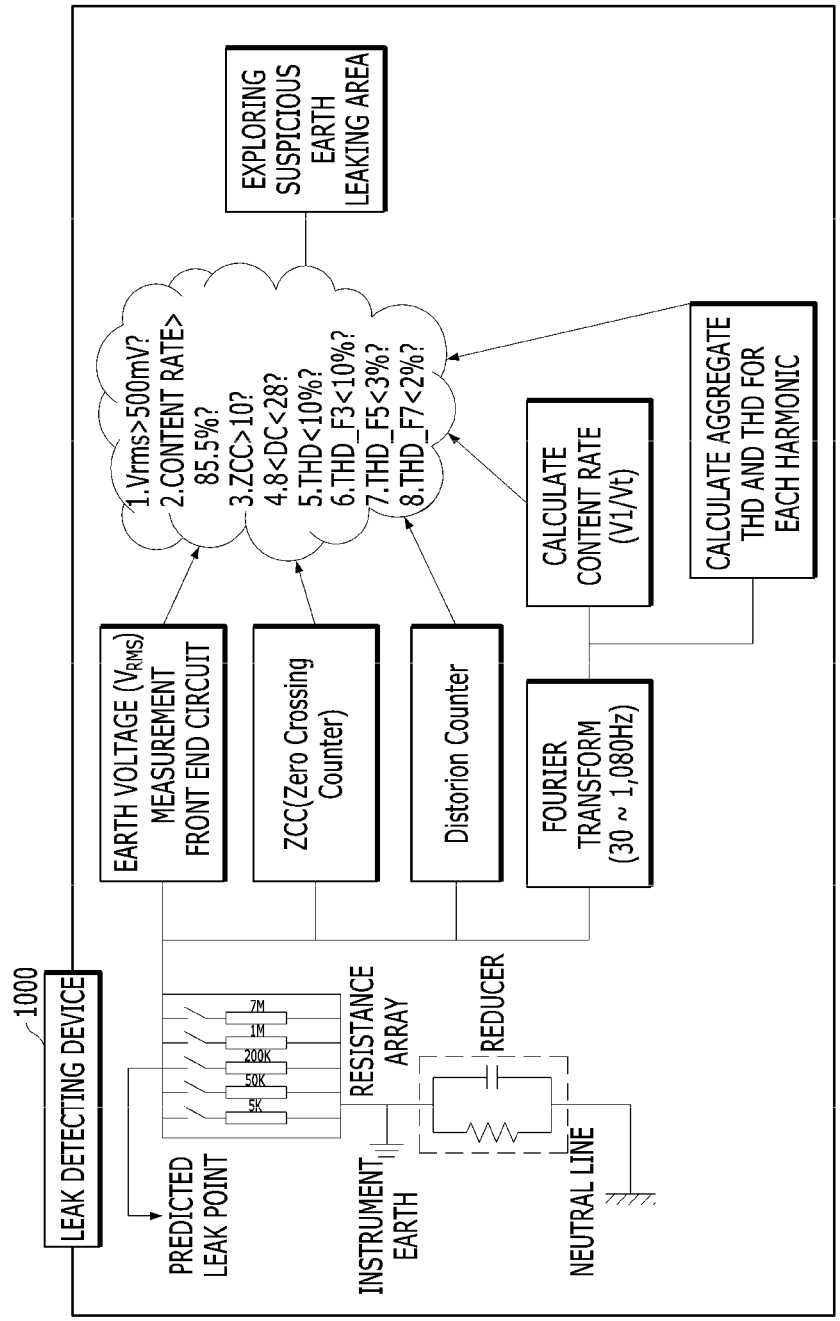
FIG. 14 illustrates an exploration configuration of a portion where the earth voltage rises by the true leak without transmission (injection) of a separate leak exploration signal, that is, a suspicious earth leaking area of the leak detecting device 1000.

FIG. 14 is a diagram illustrating an electrical leak suspecting section exploration configuration of an electrical leak detecting device 1000 capable of freely moving on an arbitrary site and determining a suspected electrical leak section without transmitting (injecting) a leak exploration signal according to the present invention. Unlike before, the Fourier transform is used without using a hardware filter to obtain the voltage (V1) of the fundamental frequency (60 Hz) and the total voltage (Vt) to obtain the content rate, THD, and etc, and ZCC or DC is counted in order to determine the distortion of the waveform.

Figure 15:
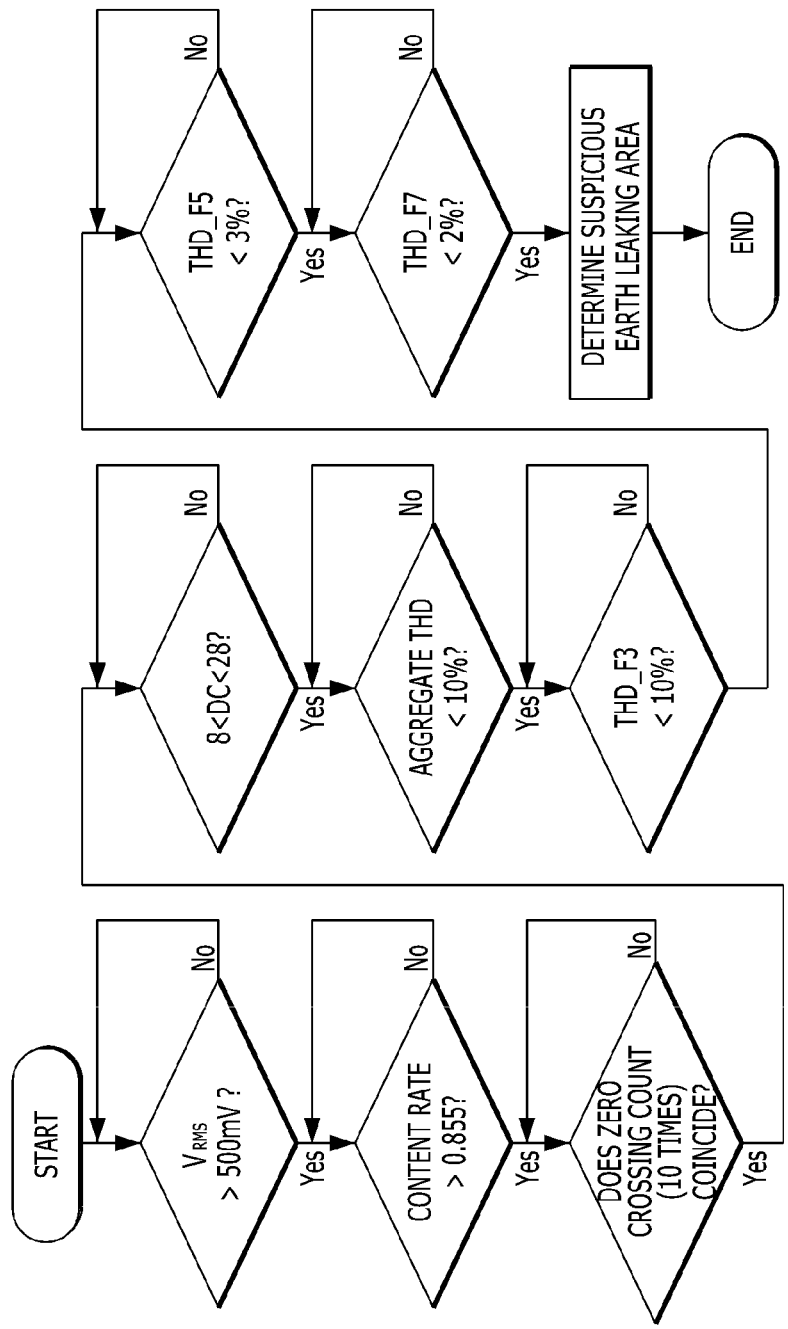
FIG. 15 is a flowchart of the exploration work of the suspicious earth leaking area of FIG. 14.

FIG. 15 illustrates a flowchart of suspicious earth leaking area exploration work, which is a function of FIG. 14.

As illustrated in FIG. 15, in order to determine the suspicious earth leaking area, first, the earth voltage V1 between the neutral line and remote earth is measured so as to determine whether the earth voltage V1 exceeds a threshold value (500 mV) and has a content rate value including a power frequency component Vf of a predetermined ratio (0.855) or more. Further, the zero-crossing count (10 times) of the earth voltage V1 is confirmed at the leak point location, and the distortion count (DC) is made to determine not the pure sine wave accurately, but the waveform including the distortion and when 8<DC<28, the corresponding voltage may be determined as the true leak voltage and when the DC deviates from the scope, the corresponding voltage may be determined as the parasitic voltage. In addition, as shown in <Table 3> above, only the earth voltage signal within the threshold value range for each harmonic may be determined as the true leak voltage. That is, it may be that there is the suspicious earth leaking area where the leak source may exist according to whether to satisfy the determinations and the suspicious earth leaking area exploration work may be terminated.

Figure 16:
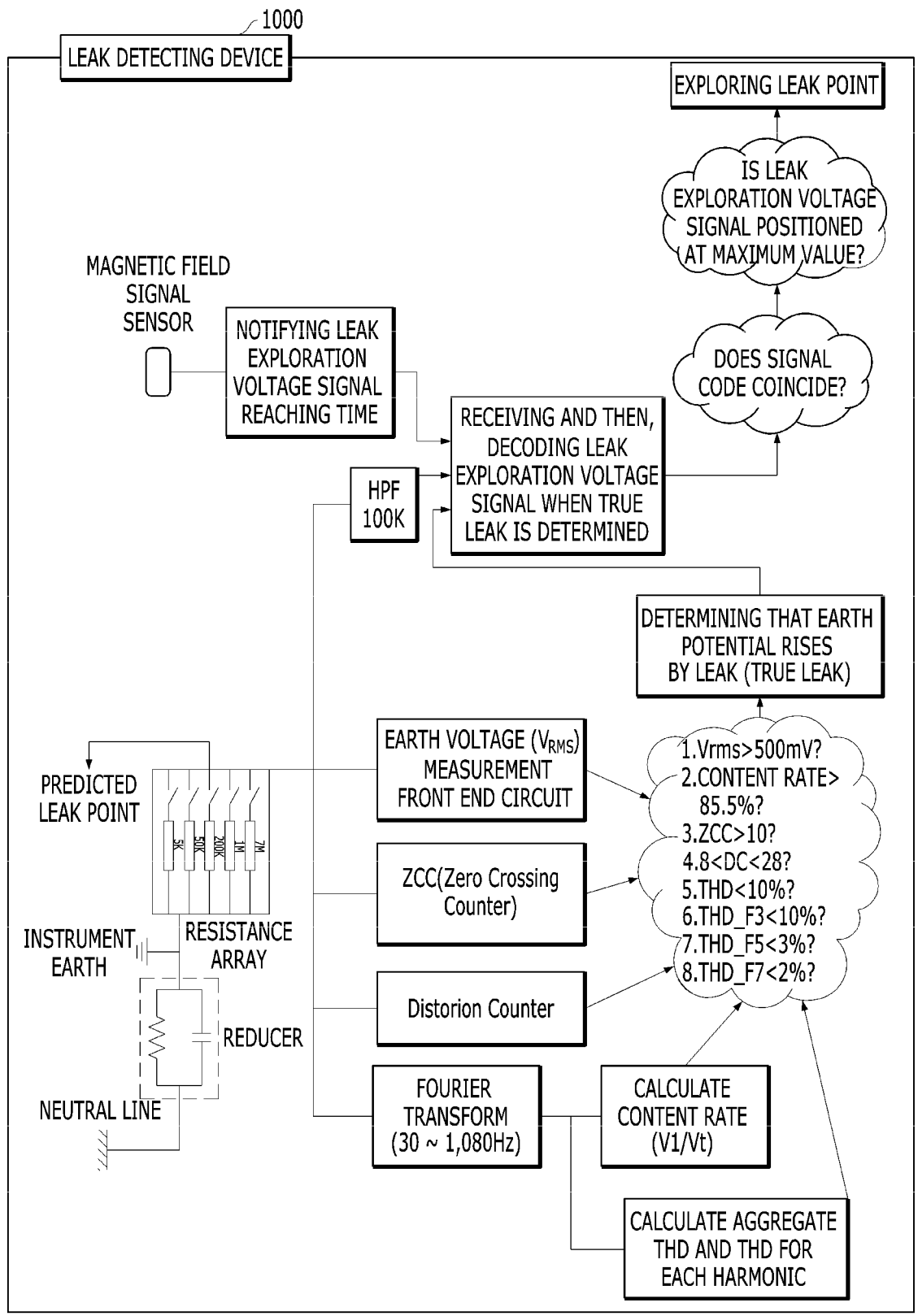
FIG. 16 illustrates a leak point detection configuration using a leak detecting device after transmission (injection) of a leak exploration signal to a power line located at an area determined as the suspicious earth leaking area in FIG. 15.

FIG. 16 is a diagram illustrating a configuration of exploring an earth leakage point of an electrical leak detecting device 1000 capable of moving along a power facility (power line) within the suspected area by transmitting (injecting) a leak exploration signal into the facility according to the present disclosure. When the leak point exploration is performed, as illustrated in FIG. 3, the leak exploration voltage and current signals are injected into power lines 202 and 203 in the suspicious earth leaking area, and the magnetic field pulse signals 111 and 112 generated by the leak exploration current signal flowing in the power line are obtained on the ground surface. The leak detecting device 1000 moves along a buried path of the power lines 202 and 203 and performs the leak exploration to find the leak point location by contacting the earth surface 105 and 106 and measuring the earth voltage. Specifically, leak exploration signal generating devices 302 and 303 are connected to the power lines 202 and 203 in the suspicious earth leaking area and the magnetic field pulse signals 111 and 112 generated by the current signal transmitted by the current pulse signal device 302 are detected on the earth. The earth voltage 212 is measured by contacting the leak detecting device 1000 with the ground surface 105 and 106 while moving along the buried path on the ground surface. At this time, the magnetic field signals 111 and 112 used in the path exploration are received and assessed in accordance with a generation time of the next leak exploration voltage pulse signal 110 to be generated and a coding value, including the leak exploration voltage pulse signal 110 is analyzed to determine the authenticity and if the coding value matches, a maximum signal detected location of the leak exploration voltage pulse signal 110 may be determined as the earth leakage point.

Figure 17:
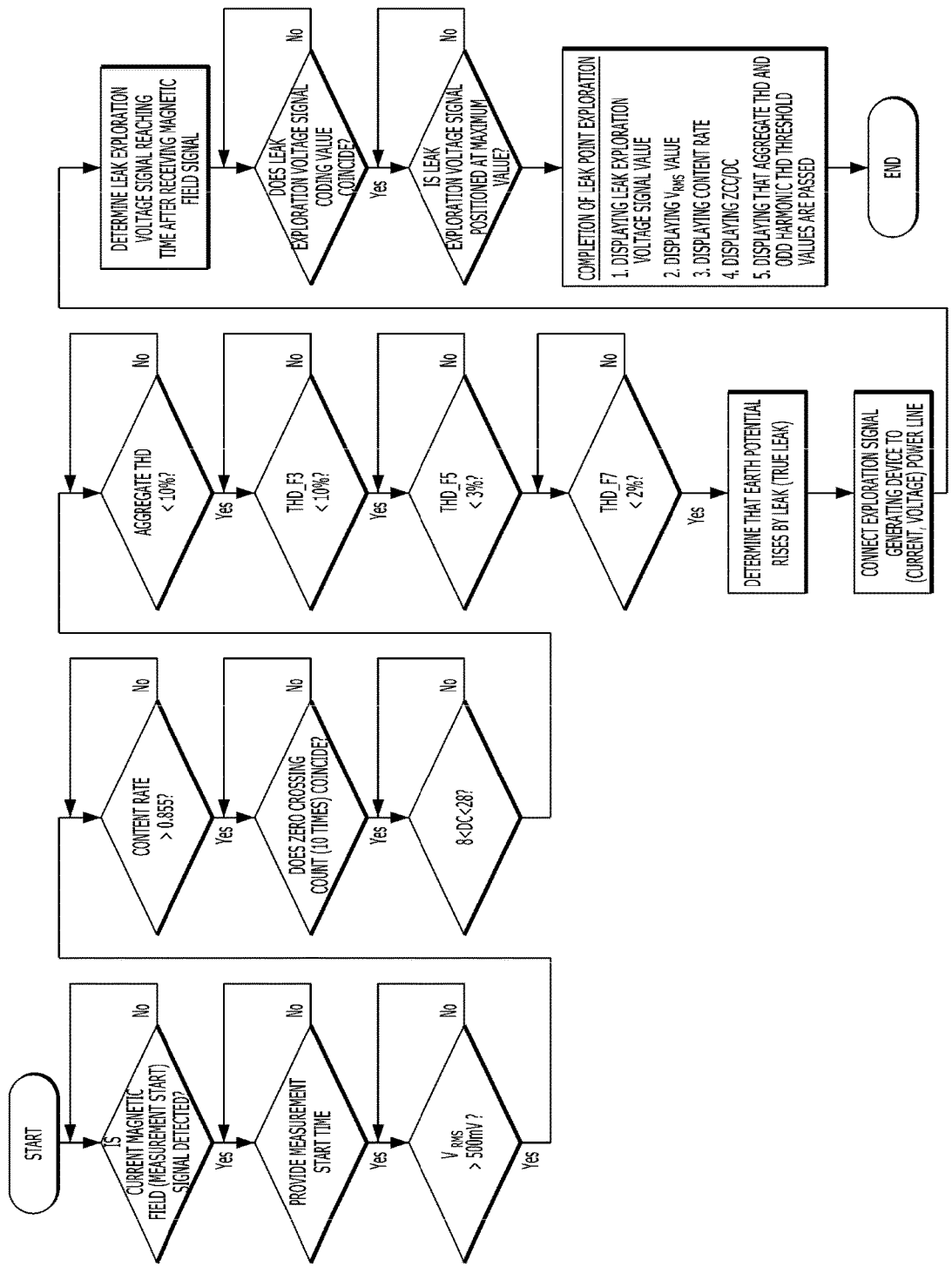
FIG. 17 is a flowchart of the leak point exploration work of FIG. 16.

FIG. 17 illustrates a flowchart of the leak exploration work using the configuration of FIG. 16.

As illustrated in FIG. 17, when the magnetic field signal by the current signal is detected, the measurement start time is provided to distinguish an earth voltage (Vrms), a content rate, a ZCC/DC, and a THD to identify the rise of the earth potential by the true earth leakage. Further, when the corresponding leak is determined as the true leak, the exploration signal generating device (current and voltage) is connected to the power line to determine a reach time of the exploration voltage signal after receiving the magnetic field signal and determine a maximum value location of the leak exploration voltage signal by considering whether to match the coding value of the leak exploration voltage signal.

Compared with the related art, the input earth voltage was filtered with hardware to calculate the content rate by using a ratio of a magnitude of the power frequency component and the total voltage. The present disclosure presents the way to increase the accuracy of the content rate to distinguish the actual leak from the earth voltage rise because of the parasitic source by calculating a ratio of a sum (total harmonics) of harmonic components and a component of power frequency after Fourier transform, thereby enhancing accuracy by adding a function to determine a distortion degree of the waveform.

Besides, the previous technology omits a parasitic voltage filtering function under the assumption that there is only a true leakage when exploring a leak point within a suspected leak area, and the magnitude of the earth voltage was measured to determine an earth leakage point without consideration of other sources of earth voltage rising. But the application of prior art in the field, it was found that parasitic voltages could exist even within the earth leaking suspicious area. In the earth leakage point detection, unlike before, a leakage point alarm is generated according to the earth leakage detection result only after determining whether the true earth voltage of the input earth voltage is true.

Figure 18:
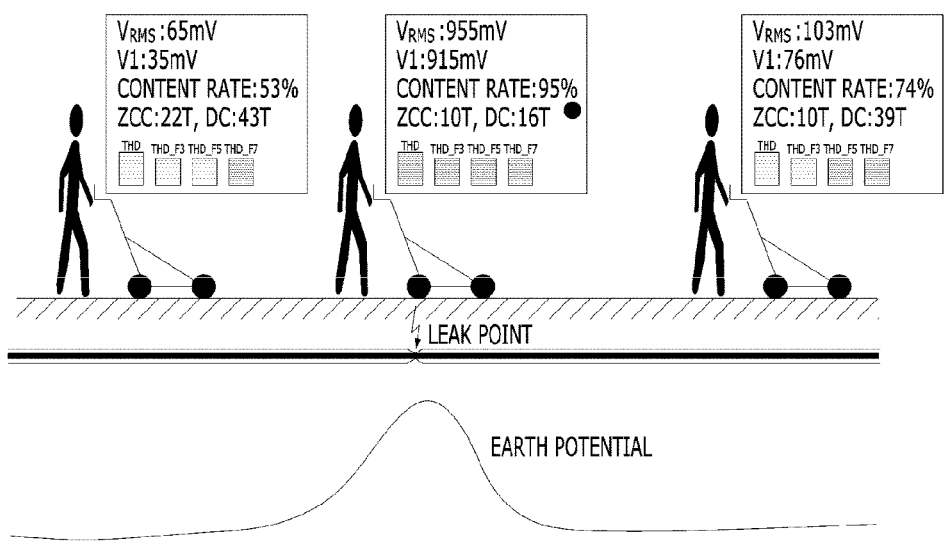
FIG. 18 describes that the portion where the earth potential rises by the true leak, that is, the suspicious earth leaking area is explored.

FIG. 18 illustrates a result of the exploration of a suspicious earth leaking area for each location according to the present disclosure. It can be seen that since the earth voltage (Vrms), the content rate, the ZCC/DC, and the THD do not reach the threshold values at a portion other than the leak point, the alarm is accurately generated only at the leak point location.

Figure 19:
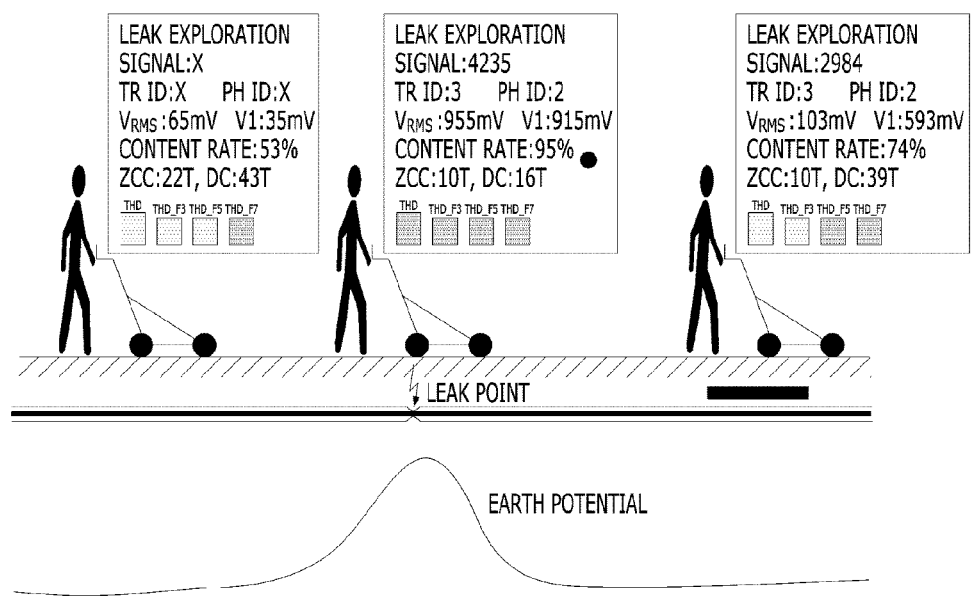
FIG. 19 describes that a leak point is explored in the suspicious earth leaking area.

FIG. 19 shows the results of the earth leakage point exploration by location. An earth leakage location is alarmed by the leak detecting device by sound and a screen of the leak detecting device shows a blinking red color lamp and signal level to locate the maximum signal position so that it can be judged as the earth leakage point. If the earth potential rises above 500 mV at the location of a parasitic voltage source as shown on the right side of the FIG. 19, the filtering algorithms based on DC (distortion counter) and THD of third harmonic block the alarm, therefore, even if the earth voltage rise is detected, but it could be determined to be not true leakage and be ignored.

Next, a screen configuration of the leak detecting device 1000 according to the present disclosure will be described.

Figure 20:
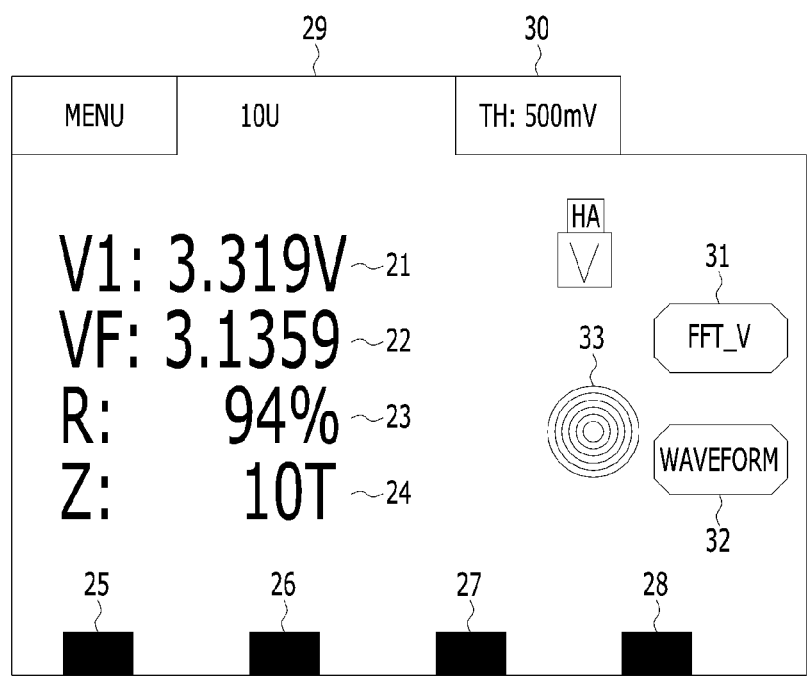
FIG. 20 illustrates an example of a screen displaying a result of exploring the portion where the earth voltage rises by the true leak without transmission (injection) of the separate leak exploration signal.

FIGS. 20 to 23 are screens showing a result of measurement at a true leak voltage location. FIG. 20 illustrates a suspicious earth leaking area exploration screen 29, and V1 21 represents the sum of all harmonic voltages, Vf 22 represents a fundamental frequency voltage of 60 Hz which is the power frequency, and R 23 represents the content rate. Further, Z 24 represents the ZCC and reference numerals 25, 26, 27, and 28 show whether THD and odd harmonic THD do not exceed the threshold values by colors. That is, as reference numerals 25, 26, 27, and 28, all four of the earth voltage (Vrms), the content rate, the ZCC/DC, and the THD satisfy conditions of the threshold values to be expressed by all red-colored boxes. When all of the conditions are satisfied, a user determines that the true leak source exists around the corresponding location to display a leak alarm 33 and perform the leak point exploration work, which might be the next process.

FIG. 21 shows a potential value for each spectrum as a result of the Fourier transform shown when button FFT_V 31 of FIG. 20 is pressed. It can be seen that the voltage of a fundamental frequency 5 is 2.8926 V (2), and the total voltage is 3.08 V (1). When the voltage of the fundamental frequency 5 and the total voltage are calculated, a content rate 4 is 94%, and even though all is not shown, the device determines that all conditions are satisfied to generate a leak alarm 3.

Figure 22:
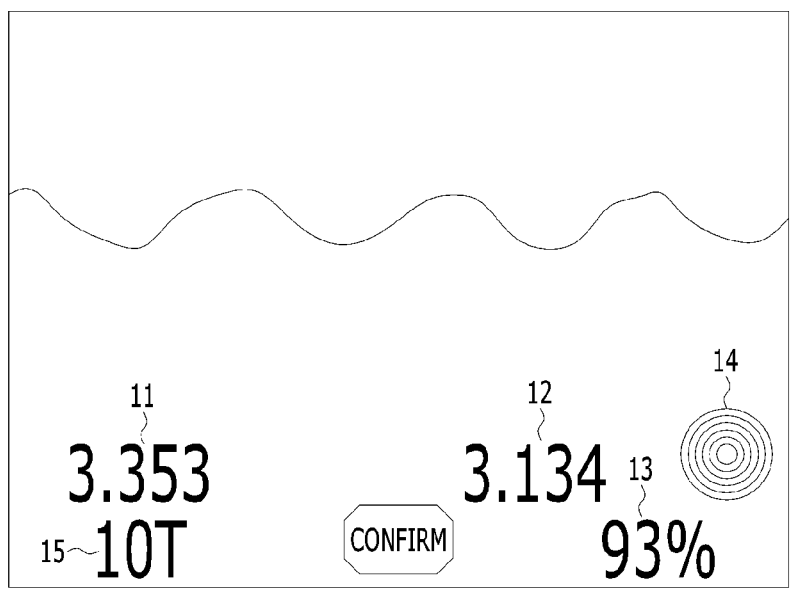
FIG. 22 illustrates an example of a screen showing the waveform of the earth voltage of which potential rises by the true leak in FIG. 20.

FIG. 22 is an exemplary diagram illustrating a waveform screen shown when a waveform (32) button of FIG. 20 is pressed. A form of the waveform of the measured earth voltage may be observed, and information on V1 11 which is the sum of all harmonic voltages, Vf 12 which is the fundamental frequency voltage of 60 Hz, which is the power frequency, the content rate 13, the ZCC 15, and the leak alarm 14 may be confirmed.

FIG. 23 is an exemplary diagram illustrating a screen captured at a maximum point of the leak signal after connecting an exploration signal device to a power line as a place illustrated in FIG. 20 is determined as a suspicious earth leaking area. A leak signal value indicates 4,625 (41), and the resulting coding values 56 and 57 are displayed. Other matters are used for determining the true leak voltage or not and are the same as in FIG. 20.

Figure 24:
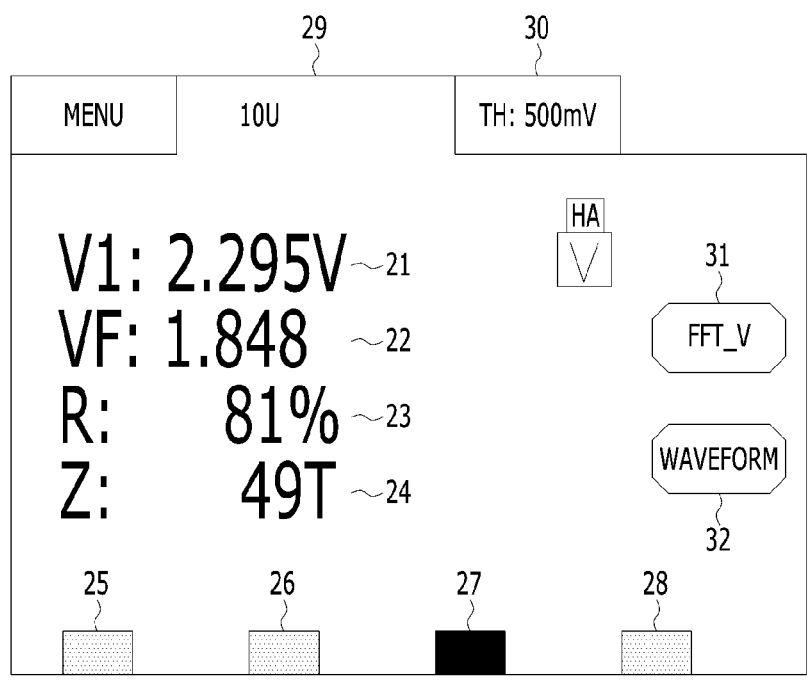
FIG. 24 illustrates an example of a screen displaying a result of exploring the portion where the earth voltage rises by the parasitic voltage without transmission (injection) of the separate leak exploration signal.

FIGS. 24 to 27 illustrate an example of a screen showing a result of measuring the parasitic voltage. FIG. 24 illustrates a screen 29 of exploring the suspicious earth leaking area or not by measuring the earth voltage of which potential rises by the parasitic voltage, and the remaining description is the same as FIG. 20. However, the total earth voltage V1 21 does not reach the threshold value of 500 mV, and the content rate R 23 does not also reach 85%. It can be seen that the distortion count shows 49, and most THDs do not satisfy the threshold value.

FIG. 25 shows the result of the Fourier transform of the earth voltage in FIG. 24. It can be seen that the content rate 4 is 82%, and the values of the fundamental frequency spectrum voltages 5 and 2 are relatively low, and the value of the third harmonic voltage 6 is higher than others and since all conditions are not satisfied, the leak alarm 3 is not generated.

Figure 26:
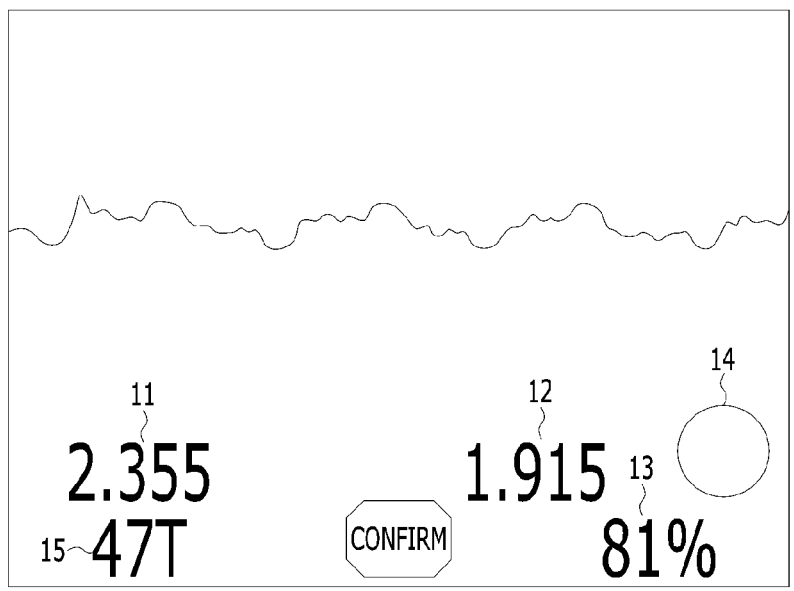
FIG. 26 illustrates an example of a screen showing the waveform of the earth voltage of which potential rises by the parasitic voltage in FIG. 24.

FIG. 26 illustrates an earth voltage waveform that appears when the waveform 32 of FIG. 24 is selected and input. As illustrated in FIG. 26, it can be seen that the corresponding waveform is the waveform containing a lot of distortion other than the pure sine wave. When it is considered that the distortion count 15 at the lower corner shows 47 times during 5 cycles, it may be easily determined that the corresponding voltage is the parasitic voltage having severe distortion other than the pure sine wave only by the DC count 15 without viewing the waveform. It is also possible to confirm that the leak alarm 14 is not generated, and the total earth voltage V1 11, the fundamental frequency voltage Vf 12, and the content rate 13 may be the same as shown in the drawing of FIG. 24.

FIG. 27 is an exemplary diagram illustrating a screen captured at a maximum point of the leak signal at the place illustrated in FIG. 24 after connecting an exploration signal device to a power line in order to reconfirm whether the erroneous determination occurs as related art even though the place is not determined as the suspicious earth leaking area before. The leak signal value indicates 4,625 (41) by the parasitic voltage, but the coding values do not coincide with each other, the leak signal value is not displayed, and it can be seen that the corresponding voltage is not the true leak voltage by considering that the DC count is 49 (48) and the content rate is 80% (49), and even though the leak voltage signal included in the parasitic voltage is detected, the corresponding voltage may not pass through other true leak voltage determination logic, and as a result, the leak signal is ignored, and the leak alarm is not generated so as not to be determined as the leak point.

FIG. 28 is a screen for selecting ZCC or DC to be counted in order to judge distortion or the like of the earth voltage waveform.

As described above, the present disclosure is a technology for finding a position where a part of power flows to the ground unintentionally and increases the ground voltage due to an insulation failure of a power facility that transmits or stores the AC commercial power. Unlike the previous technology, the present disclosure compares the configuration of voltages for each harmonic by Fourier analysis of the voltage measured on the ground, compares the distortion degree of the waveform. It has the advantage that the accident is precisely explored in advance to prevent any hurt by innocent pedestrians by performing maintenance work in proper time.

Figure 29:
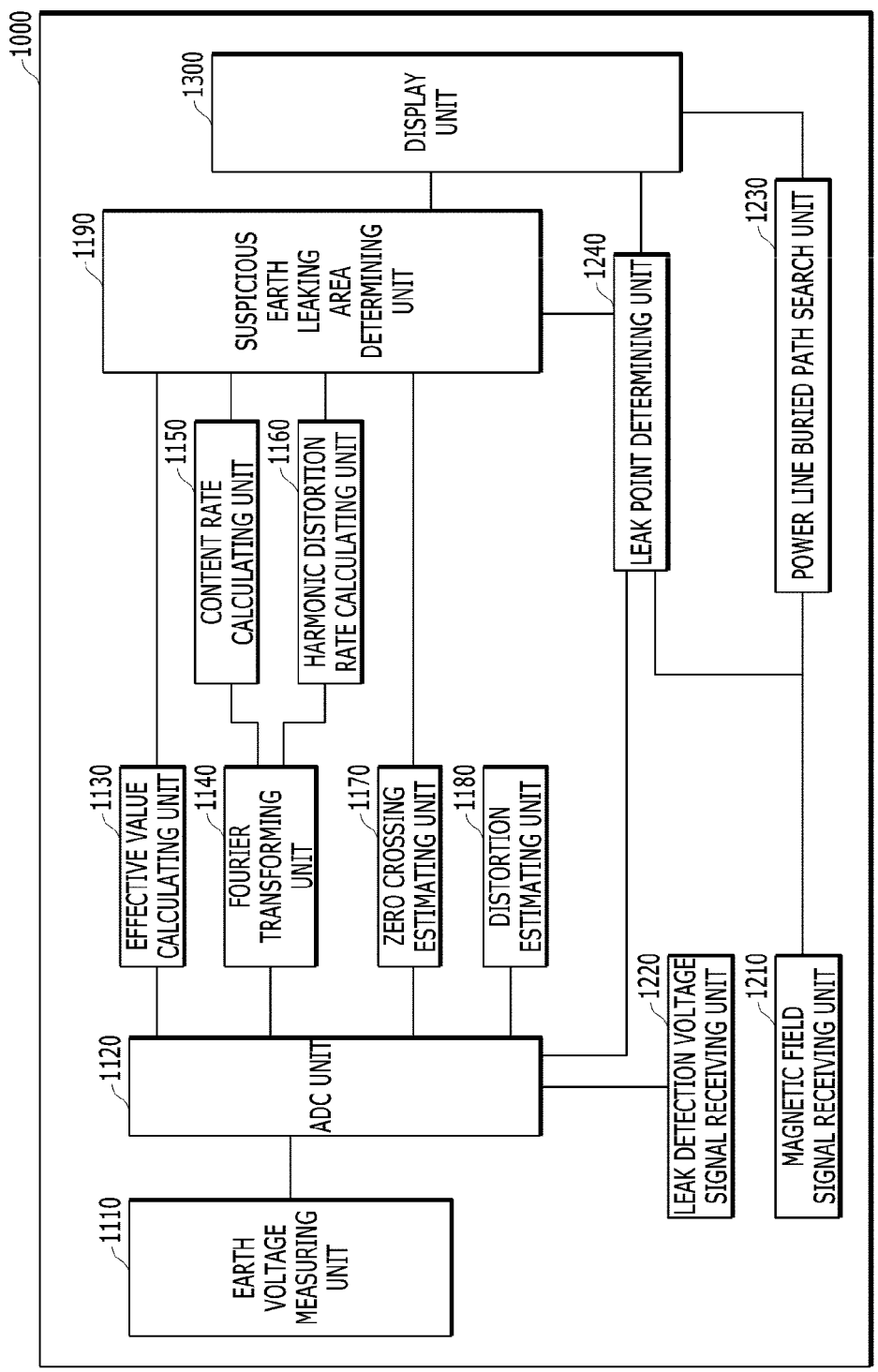
FIG. 29 is a block diagram of a leak detecting device according to another embodiment of the present disclosure.

FIG. 29 is a block diagram of a leak detecting device according to another embodiment of the present disclosure.

Referring to FIG. 29, when the earth leakage detecting device 1000 satisfies a preset condition by measuring a ground voltage, the ground fault detecting device 1000 may determine that an earth leakage out of the power line causes the measured ground voltage. In detail, in a Multiple Ground Neutral (MEN) environment, having a plurality of power line PENs (Protective Earthed Neutral) that ground the neutral line, the leak detecting device 1000 may measure the earth voltage at any power line PEN. When the measured earth voltage satisfies the predetermined condition, the leak detecting device 1000 may determine the suspicious earth leaking area that the leak occurs in the power line buried around the power line PEN measuring the earth voltage. When the suspicious earth leaking area is determined, the leak detecting device 1000 may receive a magnetic field signal generated from the exploration current generator to measure the earth voltage along a route in which the power line installed in the suspicious earth leaking area. The earth voltage measured on the buried path includes a leak detection voltage signal generated from the leak detection voltage signal generating device, and the leak detecting device 1000 may determine the leak point where the leak occurs in the power line based on the leak detection voltage signal. The leak detecting device 1000 may include an earth voltage measuring unit 1110, an ADC unit 1120, an effective value calculating unit 1130, a Fourier transforming unit 1140, a content rate calculating unit 1150, a harmonic distortion rate calculating unit 1160, a zero-crossing estimating unit 1170, a distortion estimating unit 1180, a suspicious earth leaking area determining unit 1190, a magnetic field signal receiving unit 1210, a leak detection voltage signal receiving unit 1220, a power line buried path search unit 1230, a leak point determining unit 1240 and a display unit 1300.

The earth voltage measuring unit 1110 of the leak detecting device 1000 will be described in detail with reference to FIG. 30.

Figure 30:
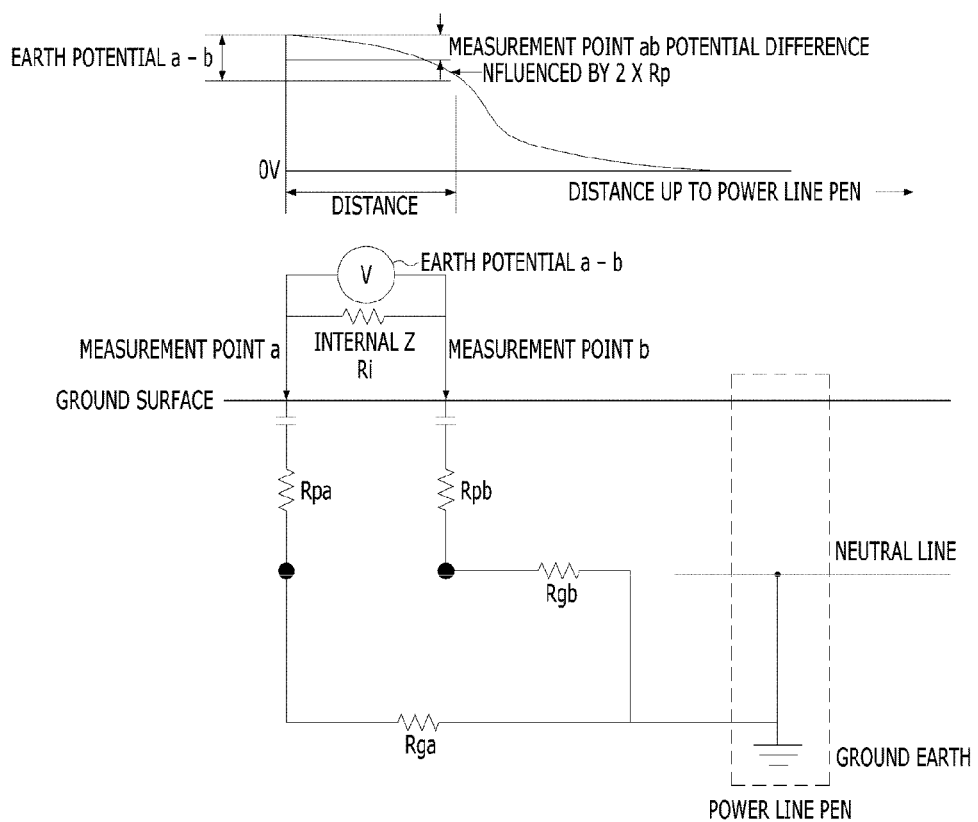
FIG. 30 illustrates an example for describing a method for measuring earth voltage in another embodiment of the present disclosure.

FIG. 30 illustrates an example for describing a method for measuring earth voltage in another embodiment of the present disclosure.

Referring to FIG. 30, the earth voltage measuring unit 1110 may measure the earth voltage. Specifically, the earth voltage measuring unit 1110 may include an electrode connected to a measurement point "a", which is a predetermined point on the ground surface, another electrode connected to a measurement point "b", which is a predetermined point on the ground surface different from the measurement point "a", a resistance array connected in parallel between the measurement points "a" and "b", and a voltage measuring unit measuring voltage between both ends of the resistance array.

More specifically, when an electrical earth leakage of the power line occurs under the ground, the leaked current is designed to be returned to the power line PEN at the shortest distance. The earth voltage measuring unit 1110 may measure the earth voltage proportional to the earth resistance Rg and the leak current of AC commercial power (in Korea, AC 60 Hz, 220V) caused by the insulation failure of the phase wire for power supply business.

For example, as shown in FIG. 30, when the AC commercial voltage is leaking out under the ground, each location of "a" and "b" in the soil might have its value of the distributed earth potential "a" and "b" according to the distance of earth resistances (Rg) to the earth leaking source of AC commercial voltage and the PEN. The earth potential of "a" and "b" in the soil could not be directly measured, but the earth leak detection device 1000 measures the earth potential on the ground surface by contacting the measurement point "a" and "b" instead to locate the earth leaking point which is underground.

The earth potentials "a" and "b" for each position in the ground are influenced by the resistance Rp including the earth resistance, the pavement layer resistance, and the contact resistance from the points "a" and "b" in the soil to reach the surface.

As shown in the graph of the earth potential distribution on the ground of the AC commercial power at the top of the Figure, the potential values of the earth potentials "a" and "b" for each position underground are changed while reaches the measurement points "a" and "b" by passing through two Rp (2×Rp).

As mentioned above, the potential value changes on the ground surface due to the effect of the resistance value Rp, and the problem is that the amplitude of the input potential is not large enough to be discerned due to the short distance between the electrodes. To solve this problem, the electrode at measurement point "a" is connected to a metal body (such as a manhole cover) that is equipotential to the power line PEN by bonding. Because in a structure housing such as a utility hole (ex, manhole) having a power line PEN, a metal cover is bonded to a grounded neutral line and maintains an equal potential (equipotential) without a potential difference between charged conductive bodies, and the earth voltage measuring unit 1110 measures the earth voltage by using the neutral line voltage as a measurement reference voltage.

When the voltage of power line PEN which is an equipotential bonded to the neutral line in the power cable is used as the reference voltage to measure the earth voltage, the influence of the resistance Rp at the measurement point "a" may be reduced and the earth voltage having a stable and large amplitude of potential difference might be measured. In addition, unlike the related art, there is no need to access the inside of the structure where the power line PEN is installed, so that a working environment may be improved and work time may be saved. The method for measuring the earth voltage is just an example, and the present disclosure is not limited thereto.

Referring again back to FIG. 29, the ADC unit 1120 of the leak detecting device 1000 samples the measured earth voltage and converts the sampled earth voltage into a digital value.

Specifically, the earth voltage measured by the earth voltage measuring unit 1110 has an analog value, and the ADC unit 1120 samples the measured earth voltage value, converts the sampled earth voltage value into a digital value and outputs the digital value.

The effective value calculating unit 1130 of the leak detecting device 1000 calculates an effective value of the earth voltage converted into the digital value.

The earth voltage generated by the leak of the AC commercial power has a more significant value than the ground voltage generated by the induced voltage or stray voltage, which is parasitic around the power line. Therefore, when the effective value of the earth voltage calculated by the effective value calculating unit 1130 has a more significant value than the predetermined threshold voltage value (e.g., 500 mV), it may be determined that the measured earth voltage is generated by the leak of the AC commercial power.

The Fourier transforming unit 1140 of the leak detecting device 1000 performs a Fourier transform on the measured earth voltage to calculate voltage for each harmonic component which is an integer multiple of the fundamental frequency—the power frequency of the AC commercial power—based on the effective value of the earth voltage.

Even if the earth voltage measured by the leak detecting device 1000 is generated by the leak of the power line, the earth voltage may include the harmonic components due to disturbance such as the parasitic voltage, the earth resistance, and the like. Therefore, it is difficult to determine whether the earth voltage measured is caused by the leak of the AC commercial power when combined with the harmonic components. So that it is necessary to analyze how many harmonic components the earth voltage contains. The Fourier transforming unit 1140 performs the Fourier transform of the measured earth voltage to calculate a voltage value having the fundamental frequency and the voltage value for each harmonic component which is an integer multiple of the fundamental frequency by setting 60 Hz, which is the power frequency of the AC commercial power (in the case of Korea, AC 60 Hz 220 V) as the fundamental frequency.

As described above, referring back to FIGS. 9 and 10, the Fourier transforming unit 1140 of the measured earth voltage may calculate the voltage value for each harmonic component, which is an integer multiple of the fundamental frequency. The measured earth voltage in FIG. 9 shows a voltage of a fundamental frequency (60 Hz) is higher than that of an integer multiple of the fundamental frequency, such as 120 Hz, 180 Hz, and 240 Hz, which are harmonic components, and thus it can see that the harmonic effect due to disturbance was less influential. Therefore, it may be determined that the measured earth voltage is generated by the leak of the AC commercial power. On the contrary, the measured earth voltage illustrated in FIG. 10 shows the harmonic components of the integer multiple of the fundamental frequency have higher amplitude than that of 60 Hz, and so it can ascertain that the harmonics much influenced the earth voltage value due to the disturbance. Therefore, it may not be determined that the measured earth voltage is generated by the leak of the AC commercial power.

Based on the voltage value of the base frequency and that of harmonics of the base frequency transformed by the Fourier transforming unit 1140, the content rate calculating unit 1150 may calculate the voltage content rate that is the ratio of a voltage value of the fundamental frequency to the voltage values obtained by adding the voltage for each harmonic component. In addition, the harmonic distortion rate calculating unit 1160 can calculate the total harmonic distortion rate and a harmonic distortion factor based on the voltage value for fundamental and each harmonic component.

Based on the voltage of each harmonic component, the content rate calculating unit 1150 of the leak detecting device 1000 may calculate the voltage content rate (V1/Vt) by comparing the voltage of the fundamental frequency to the voltage acquired by adding the voltages for each harmonic component.

The higher the content rate calculated by the content rate calculating unit 1150 is, the measured earth voltage has more components for the fundamental frequency. Therefore, when the content rate exceeds the predetermined content rate (e.g., 85%), it may be determined that the measured earth voltage is generated by the leak of the AC commercial power.

As described above, referring back to Tables 1 and 2, in Table 1, the content rate of the voltage having the fundamental frequency component with respect to the total voltage exceeds the predetermined content rate (for example, 85%), but the content rate of the voltage having the fundamental frequency component to the total voltage does not exceed the predetermined content rate (for example, 85%) in Table 2. Therefore, it may be determined that the earth voltage measured in Table 1 is generated by the leak of the AC commercial power. The method for determining that the earth voltage is generated by the leak based on the content rate is just an example, and the present disclosure is not limited thereto.

In addition, the harmonic distortion rate calculating unit 1160 of the leak detecting device 1000 may calculate the total harmonic distortion rate and a harmonic distortion factor based on the voltage for each harmonic component.

The total harmonic distortion rate may be calculated by Equation 3. The harmonic distortion factor may be calculated by Equation 4. It shows that the higher the total harmonic distortion rate and the harmonic distortion factor by the harmonic element, the more harmonic components are included.

When the total harmonic distortion calculated by the harmonic distortion rate calculating unit 1160 is less than a predetermined distortion rate and when the harmonic distortion factor is less than a predetermined distortion rate, it may be determined that the measured earth voltage is less influenced by the harmonics. When it is determined that the measured earth voltage is less influenced by the harmonics, accuracy and reliability may be increased, which may determine that the earth voltage is generated by the leak of the AC commercial power by calculating the effective value, the content rate, and the zero-crossing count based on the measured earth voltage.

The zero-crossing estimating unit 1170 of the leak detecting device 1000 may estimate the zero-crossing count at which the earth voltage converted into the digital value passes through zero voltage for a predetermined time T1. Here, the predetermined time T1 may be a time which is a predetermined integer multiple of a cycle of the AC commercial power.

The zero-crossing estimating unit 1170 may estimate the zero-crossing count passing through the zero voltage when the polarity of the earth voltage is changed for the predetermined time T1.

The number of zero-crossings in a measured earth voltage estimated by the zero-crossing estimating unit 1170 may contain most of the fundamental frequency in AC commercial power, and it could determine that the leakage of AC commercial voltage generates the earth voltage at the measuring place.

For example, the predetermined time T1 may be set to 5 times of the cycle of the AC commercial power. In this case, the zero-crossing count of AC commercial power is 10. If the zero-crossing count of the measured earth voltage is 10, it may be determined that the earth voltage contains more 60 Hz components and the measured earth voltage is generated by the leak of the AC commercial voltage. On the other hand, if the zero-crossing count of the measured earth voltage exceeds 10, it may be determined that the earth voltage contains more frequency components other than 60 Hz and the earth voltage is generated by the influence of the harmonics or by the parasitic voltage.

Further, as described above, referring back to FIG. 7, the measured earth voltage is similar to the 60 Hz waveform, which is the power frequency. However, since the content rate is less than the predetermined content rate (for example, 85%), it may be determined that the earth voltage is not generated by the leak but the parasitic voltage. Referring back to FIG. 8, the content rate of the measured earth voltage exceeds the predetermined content rate (e.g., 85%), but the waveform is not similar to the waveform of 60 Hz, which is the power frequency and the zero-crossing count of the earth voltage exceeds the zero-crossing count of the AC commercial power for the predetermined time T1. So, it may be determined that the earth voltage is not generated by the leak, but raised by the influence of the harmonics or the parasitic voltage.

The method for determining that the earth voltage is generated by the leak of the AC commercial voltage based on the zero-crossing count is just an example, and the present disclosure is not limited thereto.

The distortion estimating unit 1180 of the leak detecting device 1000 may estimate the distortion count, which is the number of times at which the distortion by the harmonics occurs in the measured earth voltage for the predetermined time T1. Here, the predetermined time T1 may be a time which is a predetermined integer multiple of a cycle of the AC commercial power.

A specific method of estimating the number of distortions by the distortion estimating unit 1180 will be described with reference to FIGS. 31 and 32.

Figure 31:
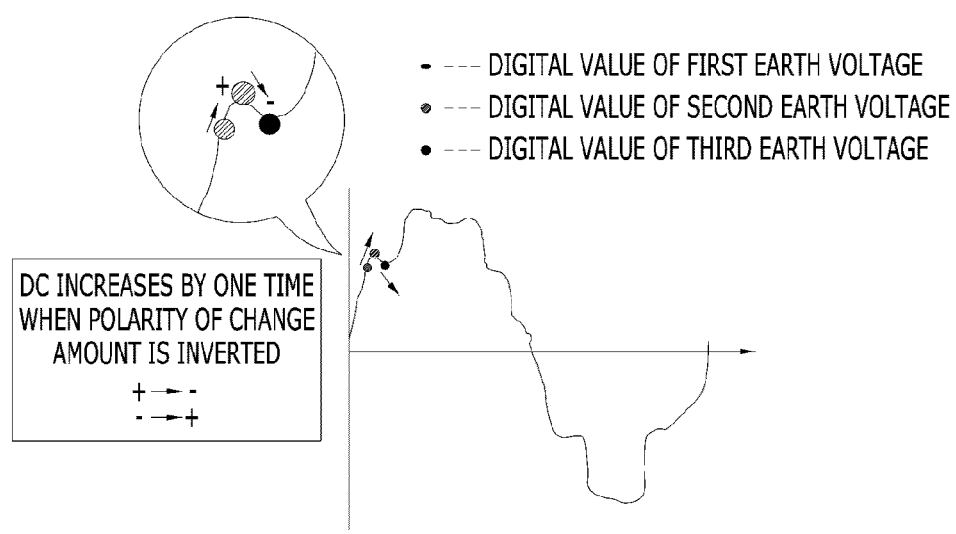
FIG. 31 illustrates an example for describing a method for calculating the number of distortion times according to another embodiment of the present disclosure.

FIG. 31 illustrates an example for describing a method for calculating the number of distortions, according to another embodiment of the present disclosure.

Referring to FIG. 31, when the polarity of a first change amount of a digital value of first earth voltage converted through sampling and a digital value of second earth voltage converted through sampling after a next sampling period and the polarity of a second change amount of a digital value of the second earth voltage and a digital value of third earth voltage converted through sampling after a next sampling period are different from each other, the distortion estimating unit 1180 determines that the distortion by the harmonics occurs to estimate the distortion count. For example, when the digital value of the first earth voltage is 50 mV and the digital value of the second earth voltage sampled next is 53 mV, the first change amount as (+)3 mV has a positive polarity. When the digital value of the third earth voltage sampled next is 52 mV, the second change amount as (−) 1 mV has a negative polarity. In this case, the polarity of the first change amount and the polarity of the second change amount are different from each other, and it may be determined that the distortion by the harmonics occurs and the distortion count may be estimated.

Figure 32:
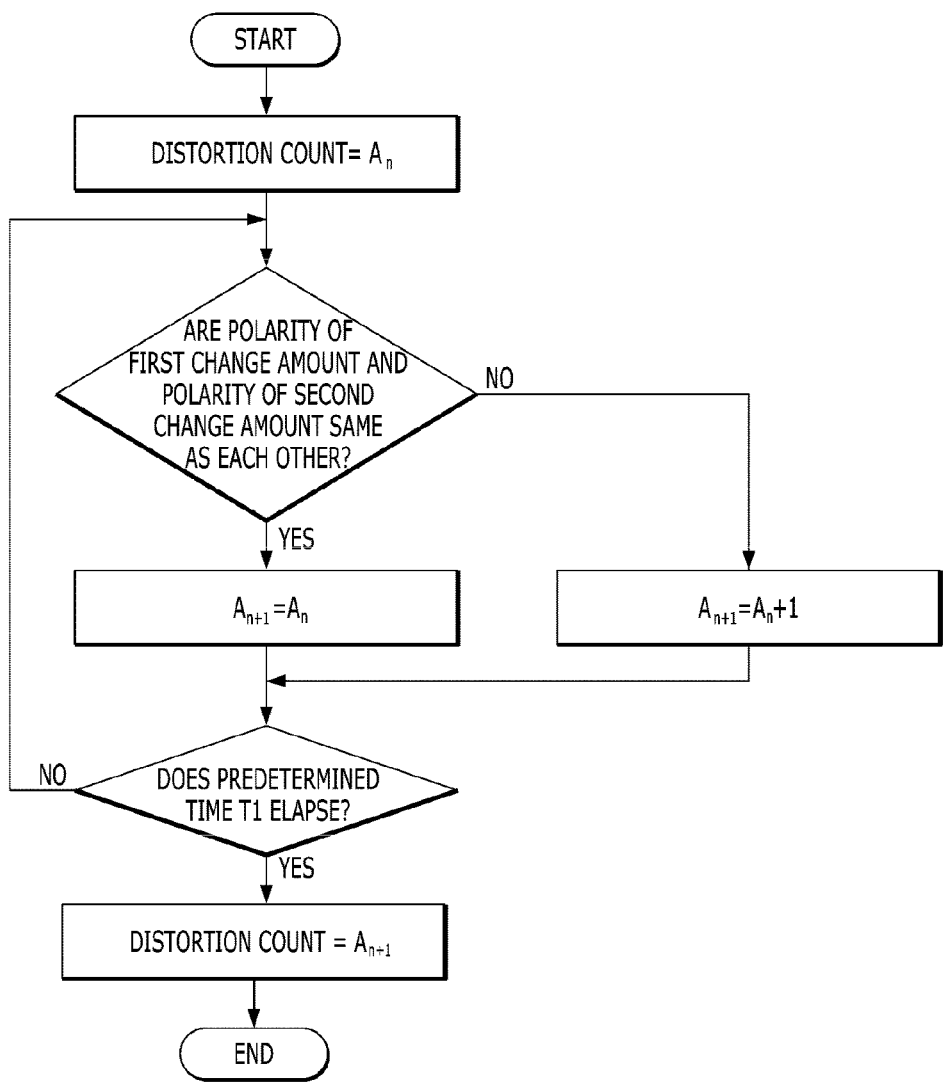
FIG. 32 is a flowchart for the method for calculating the number of distortion times according to another embodiment of the present disclosure.

FIG. 32 is a flowchart for the method for calculating the number of distortion times according to another embodiment of the present disclosure.

Referring to FIG. 32, when the polarity of the first change amount is different from the polarity of the second change amount, the distortion estimating unit 1180 may estimate one time as the distortion count. When the total distortion count estimated for the predetermined time T1 is less than a predetermined distortion count, it is determined that the harmonics fewer influences the measured earth voltage. When it is determined that the harmonics less influences the measured earth voltage, accuracy and reliability may be increased, which may determine that the earth voltage is generated by the leak of the AC commercial power by calculating the effective value, the content rate, and the zero-crossing count based on the measured earth voltage.

Referring back to FIG. 29, the suspicious earth leaking area determining unit 1190 of the leak detecting device 1000 may determine that the earth voltage is generated by the leak of the AC commercial power based on at least any one of the effective value of the earth voltage, the voltage content rate, the total harmonic distortion, the harmonic distortion factor, the zero-crossing count, and the distortion count and determine a region where the earth voltage is measured as the suspicious earth leaking area based on the determination result.

More specifically, the suspicious earth leaking area determining unit 1190 may determine that the earth voltage is generated by the leak of the AC commercial power when the effective value of the earth voltage exceeds a predetermined threshold voltage value, the voltage content rate exceeds a predetermined voltage content rate, the total harmonic distortion is less than a predetermined total harmonic distortion, the harmonic distortion factor is less than a predetermined harmonic distortion factor, the zero-crossing count coincides with a predetermined count, and the distortion count is less than a predetermined count. The method for determining the suspicious earth leaking area is just an example, and the present disclosure is not limited thereto.

When the suspicious earth leaking area determining unit 1190 determines an area as a suspicious earth leaking area where might have an earth leak source of AC commercial power around after measuring an earth voltage reference to a power line PEN, then the leak point determining unit 1240 may determine an earth leaking point by an actual earth leaking source along a buried cable path of the said power line PEN.

The magnetic field signal receiving unit 1210 of the leak detecting device 1000 may receive the magnetic field signal generated from the exploration current generating device.

As described above, the exploration current generating device injects the current signal into the phase and neutral line within the suspicious earth leaking area, and the magnetic field signal receiving unit 1210 may receive the magnetic field signal generated by flowing current of exploration signal which flows through the phase and neutral line in the ground.

The magnetic field signal receiving unit 1210 may include a plurality of magnetic field sensors and may receive the magnetic field signal polarity and the magnitude of the magnetic field signal.

The power line buried path search unit 1230 of the leak detecting device 1000 may search the path of the power line buried in the suspicious earth leaking area based on the received magnetic field signal.

For example, the power line buried path search unit 1230 may determine a point where the magnitude of the magnetic field signal is the maximum point as a buried power line path. Further, the power line buried path search unit 1230 may search a direction of a path in which the power line is buried based on the magnetic field signal polarity.

The leak detection voltage signal receiving unit 1220 of the leak detecting device 1000 may receive the leak detection voltage signal generated from the leak detection voltage signal generating device.

As described above, the leak detection voltage signal generating device transmits the leak detection voltage signal, which is DC pulse voltage, to the power line. When the leak occurs in the power line, the AC commercial power and the leak detection voltage signal to be measured together in the earth voltage, but the earth voltage also includes harmonic components so that it might be difficult to identify the leak detection voltage signal out of the earth voltage when mixed with other components measured by the earth voltage measuring unit 1110. Therefore, the leak detection voltage signal generating device transmits the leak detection voltage signal after a predetermined set time from when the time of the exploration current generating device transmits the exploration current signal. Based on the time, when the magnetic field signal receiving unit 1210 receives the magnetic field signal generated by the exploration current transmitter, the leak detection voltage signal receiving unit 1220 may detect the leak detection voltage signal in the earth voltage measured on the ground surface after a certain time of receiving the magnetic field signal.

The leak point determining unit 1240 of the leak detecting device 1000 may determine the leak point of the power line buried based on the leak detection voltage signal.

The leak point determining unit 1240 may set a logical value according to whether receive the leak detection voltage signal and determine a point where the set logical value and a logical value of the leak detection voltage signal generated by the leak detection voltage signal generating device coincide with each other and the magnitude of the leak detection voltage signal has a maximum value as the leak point.

A detailed description of the leak point determining unit 1240 moving along the power line buried path and determining the leak point of the power line will be described below with reference to FIGS. 33 and 34.

Figure 33:
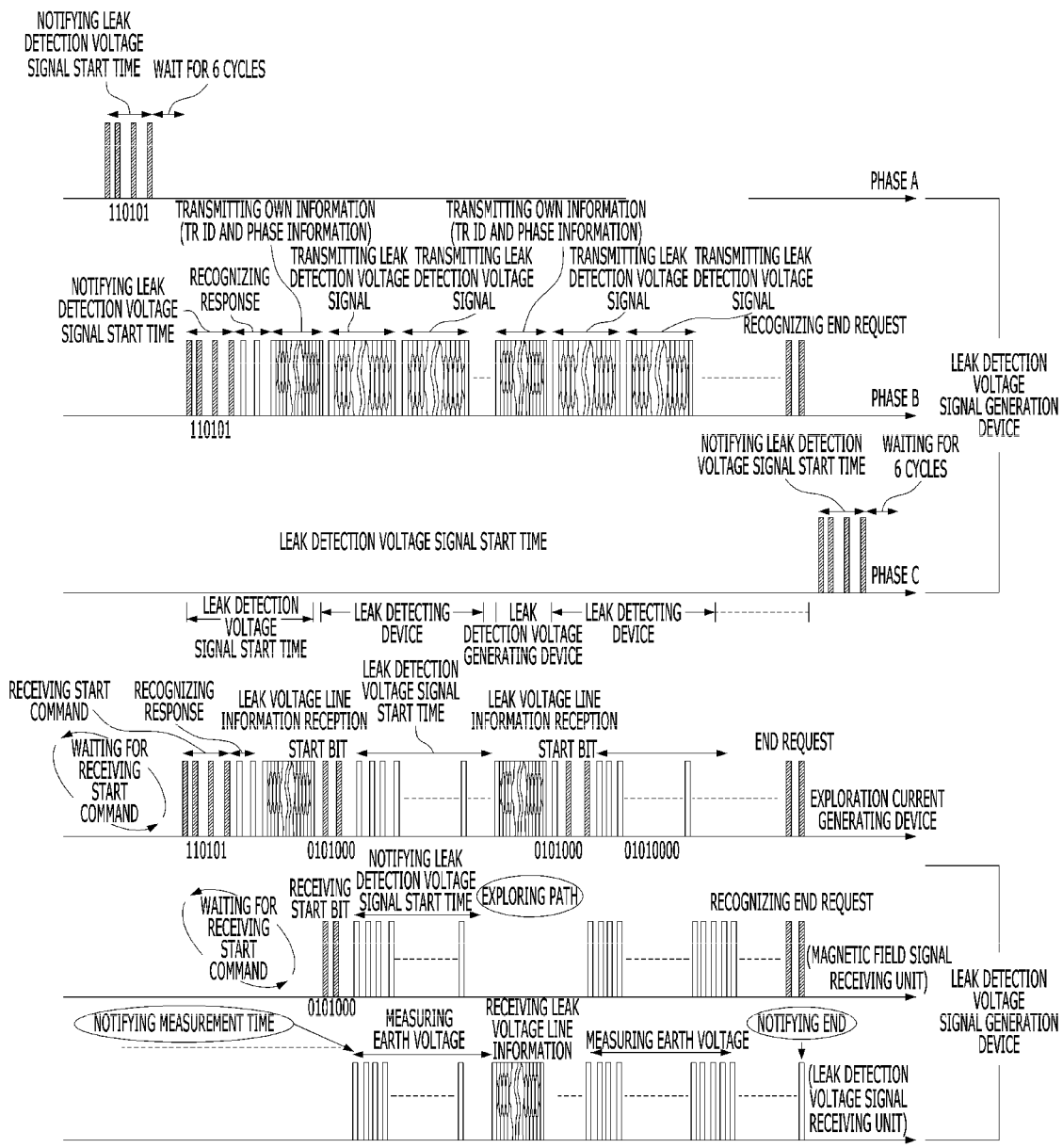
FIG. 33 is an explanatory diagram of a protocol for receiving a magnetic field signal and receiving a leak detection voltage signal according to another embodiment of the present disclosure.

FIG. 33 is an explanatory diagram of a protocol for receiving a magnetic field signal and receiving a leak detection voltage signal according to another embodiment of the present disclosure.

As a specific example with reference to FIG. 33, when the magnetic field signal receiving unit 1210 receives a magnetic field signal '0101000' having a discontinuous characteristic generated from the exploration current generating device, the power line buried path search unit 1230 sets a magnetic field signal start time. The power line buried path search unit 1230 measures the magnetic field signal value every power frequency cycle after the magnetic field signal start time to search the power line buried path based on the polarity and the magnitude of the magnetic field signal.

The leak detecting device 1000 measures the earth voltage on the ground surface above a buried path of the power line and moves along the path. The leak detection voltage signal receiving unit 1220 receives the leak detection voltage signal at the earth voltage measured on the path where the power line is buried. The leak point determining unit 1240 analyzes the logical value included in the leak detection voltage signal and compares the magnitude of the leak detection voltage signal when the logical value is '1' to determine the point where the leak detection voltage signal has the maximum value as the leak point.

Figure 34:
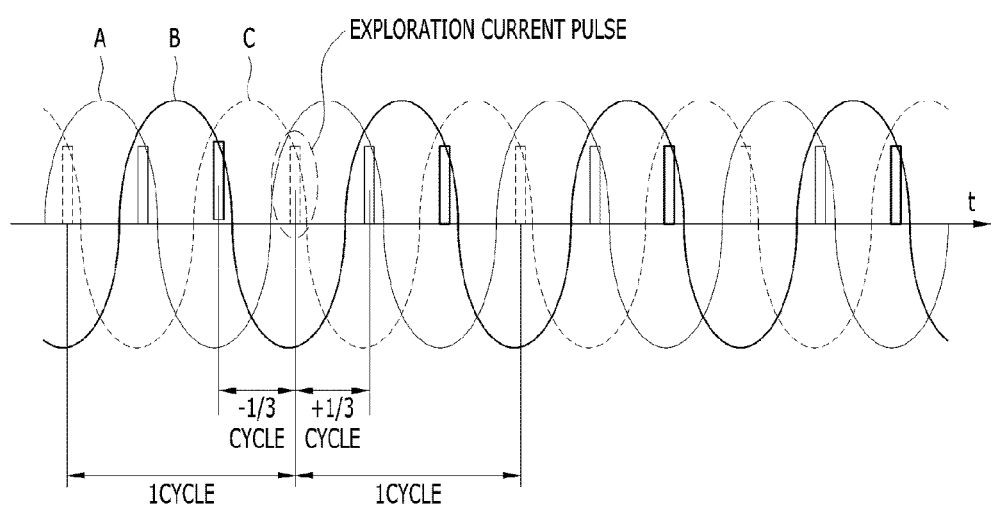
FIG. 34 illustrates an example showing a relationship between a start time notification by the leak detection voltage signal and a time when the leak detection voltage signal is measured according to another embodiment of the present disclosure.

FIG. 34 illustrates an example showing a relationship between a leak detection voltage signal start time notification and a time when the leak detection voltage signal is measured according to another embodiment of the present disclosure.

Referring to FIG. 34, each of 3-phase powers has a phase difference of 120 degrees, and a sine wave voltage waveform is repeated. When the exploration current generating device transmits the exploration current signal to a C-phase power line, the leak detection voltage signal generating device transmits the leak detection voltage signal to an A-phase power line in which a phase is lagged by 120 degrees. The leak detection voltage signal is transmitted after a predetermined time (e.g., a time within ⅓ cycle after the time of transmitting the exploration current signal) from the time of transmitting the exploration current signal. When the exploration current signal generates the magnetic field signal and the magnetic field signal receiving unit 1210 receives the magnetic field signal, the leak detection voltage signal receiving unit 1220 receives the leak detection voltage signal after the predetermined time (e.g., the time within ⅓ cycle after the time of transmitting the exploration current signal) from the time of transmitting the exploration current signal) from the time when the magnetic field signal receiving unit 1210 receives the magnetic field signal.

The display unit 1300 of the leak detecting device 1000 may display whether the measured earth voltage is caused by the leak of the AC commercial power.

Referring back to FIGS. 20 to 28, as described above, the display unit 1300 may display a voltage magnitude of the power frequency and a voltage magnitude obtained by adding the voltage for each harmonic component. Further, the display unit 1300 may display the content rate of the measured earth voltage, the zero-crossing count, and the distortion count. In addition, the display unit 1300 may display the magnitude of the voltage of each harmonic component and display whether the harmonic distortion factor is less than the predetermined distortion rate through color classification. Further, the display unit 1300 may display the logical value of the leak detection voltage signal and can display the power line of the leaked phase.

Figure 35:
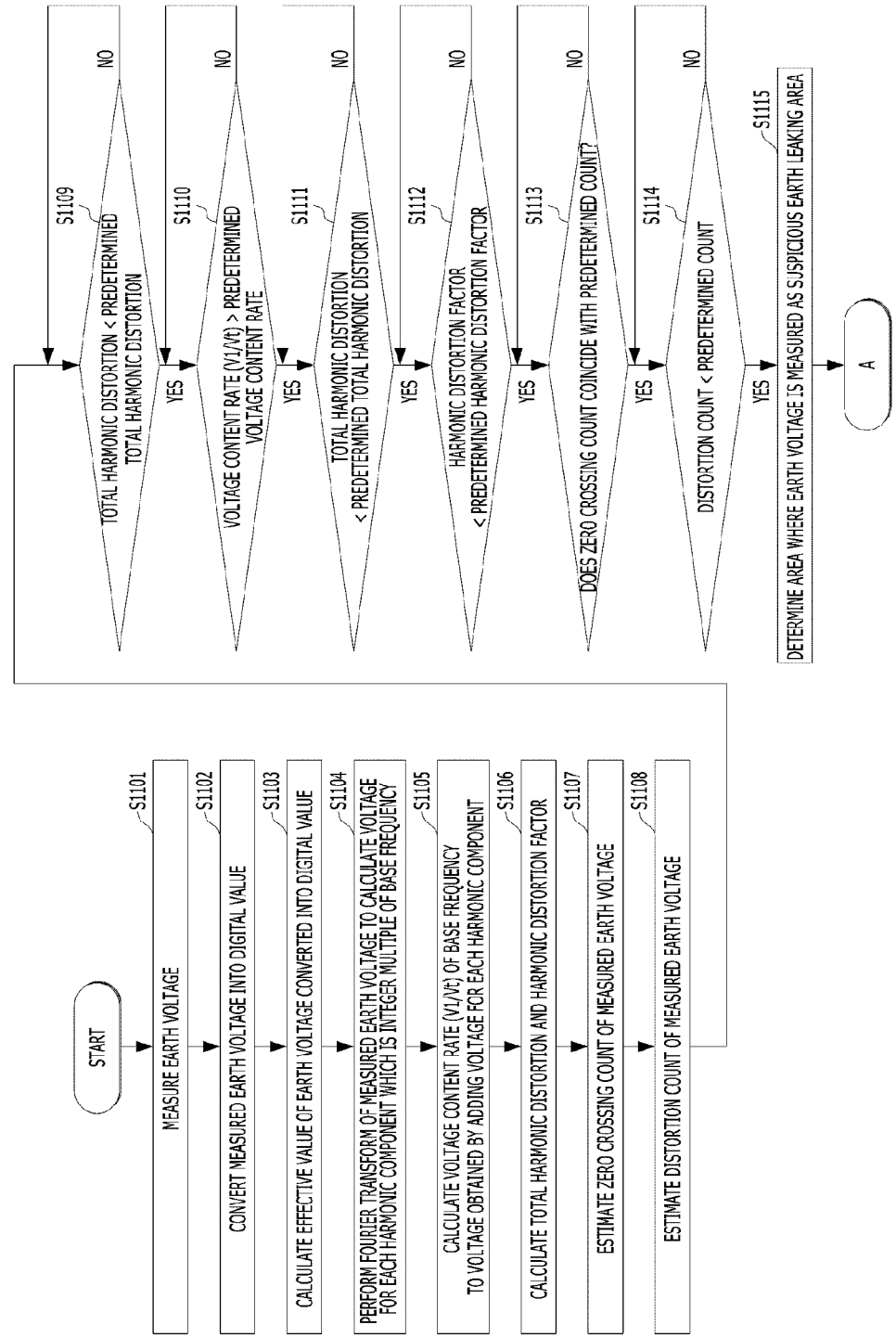
FIG. 35 is a flowchart for a method for determining another suspicious earth leaking area according to another embodiment of the present disclosure.

FIG. 35 is a flowchart for a method for determining another suspicious earth leaking area according to another embodiment of the present disclosure.

The leak detecting device 1000 may measure the earth voltage (S1101). Specifically, in the case where the leak occurs in the power line in the ground, the leak current is designed to be return to the power line PEN within the shortest distance. The leak detecting device 1000 may measure the earth voltage based on the earth resistance Rg and the leak current of AC commercial power (in Korea, AC 60 Hz, 220V) caused by the insulation failure of the power line (commercial line) for power supply.

The leak detecting device 1000 samples the measured earth voltage and converts the sampled earth voltage into the digital value (S1102).

Specifically, the earth voltage measured by the leak detecting device 1000 has an analog value, and the leak detecting device 1000 samples the measured earth voltage value, converts the sampled earth voltage value into the digital value and outputs the digital value.

The leak detecting device 1000 calculates the effective value of the earth voltage converted into the digital value (S1103).

The earth voltage generated by the leak of the AC commercial power has a more significant value than the ground voltage generated by the induced voltage or stray voltage, which is parasitic around the power line. Therefore, when the effective value of the earth voltage calculated by the leak detecting device 1000 has a more significant value than the predetermined threshold voltage value (e.g., 500 mV), it may be determined that the measured earth voltage is generated by the leak of the AC commercial power.

The earth leak detecting device 1000 performs a Fourier transform on the measured earth voltage to calculate voltage for each harmonic component, which is an integer multiple of the fundamental frequency—the power frequency of the AC commercial power—based on the effective value of the earth voltage (S1104).

Even if the leak of the power line generates the earth voltage measured by the leak detecting device 1000 the earth voltage may include the harmonic component due to disturbance such as the parasitic voltage, the earth resistance, and the like. Therefore, it is difficult to determine whether the earth voltage measured by the harmonic component is caused by the leak of the AC commercial power, so that it is necessary to analyze how many harmonic components the earth voltage contains.

The leak detecting device 1000 performs the Fourier transform of the measured earth voltage to calculate a voltage value having the fundamental frequency and the voltage value for each harmonic component which is an integer multiple of the fundamental frequency by setting 60 Hz which is the power frequency of the AC commercial power (in the case of Korea, AC 60 Hz 220 V) as the fundamental frequency.

As described above, referring back to FIGS. 9 and 10, the Fourier transforming unit of the measured earth voltage may calculate the voltage value for each harmonic component, which is an integer multiple of the fundamental frequency. In can be seen that the measured earth voltage illustrated in FIG. 9 contains the voltage having the fundamental frequency of 60 Hz more than the voltage having the integer multiple of the fundamental frequency, such as 120 Hz, 180 Hz, 240 Hz, or the like which are the harmonic components, so that the earth voltage may be less influenced by the harmonics due to the disturbance, and the like. Therefore, it may be determined that the measured earth voltage is generated by the leak of the AC commercial power. On the contrary, it can be seen that the measured earth voltage illustrated in FIG. 10 contains more voltage having the integer multiple of the fundamental frequency, such as 120 Hz, 180 Hz, 240 Hz, or the like, which are the harmonic components, so that the harmonics may much influence the earth voltage due to the disturbance, and the like. Therefore, it may not be determined that the measured earth voltage is generated by the leak of the AC commercial power.

Based on the voltage of each harmonic component, the leak detecting device 1000 may calculate the voltage content rate (V1/Vt) by comparing the voltage of the fundamental frequency to the voltage acquired by adding the voltages for each harmonic component (S1105).

The higher the content rate calculated by the leak detecting device 1000 is, the measured earth voltage has more components for the fundamental frequency. Therefore, when the content rate exceeds the predetermined rate (e.g., 85%), it may be determined that the measured earth voltage is generated by the leak of the AC commercial power.

As described above, referring back to Tables 1 and 2, in Table 1, the content rate of the voltage having the fundamental frequency component with respect to the total voltage exceeds the predetermined content rate (for example, 85%), but in Table 2, the content rate of the voltage having the fundamental frequency component to the total voltage does not exceed the predetermined content (for example, 85%). Therefore, it may be determined that the earth voltage measured in Table 1 is generated by the leak of the AC commercial power. The method for determining that the earth voltage is generated by the leak based on the content rate is just an example, and the present disclosure is not limited thereto.

The leak detecting device 1000 may calculate the total harmonic distortion rate and a harmonic distortion factor based on the voltage value for each harmonic component (S1106).

The total harmonic distortion rate may be calculated by Equation 3. The harmonic distortion factor may be calculated by Equation 4. The higher the total harmonic distortion rate and the harmonic distortion factor, the more the harmonic components.

When the total harmonic distortion calculated by the leak detecting device 1000 is less than a predetermined distortion rate, and when the harmonic distortion factor is less than a predetermined distortion rate, it may be determined that the harmonics less influences the measured earth voltage. When it is determined that the harmonics less influences the measured earth voltage, accuracy and reliability may be increased, which may determine that the earth voltage is generated by the leak of the AC commercial power by calculating the effective value, the content rate, and the zero-crossing count based on the measured earth voltage.

The leak detecting device 1000 may estimate the zero-crossing count at which the earth voltage converted into the digital value passes through zero voltage for a predetermined time T1 (S1106). Here, the predetermined time T1 may be a time which is a predetermined integer multiple of a cycle of the AC commercial power.

The leak detecting device 1000 may estimate the zero-crossing count passing through the zero voltage when the polarity of the earth voltage is changed for the predetermined time T1.

The zero-crossing count estimated by the leak detecting device 1000 may determine that the measured earth voltage contains more fundamental frequency components, which are the power frequency of the AC commercial power and the measured earth voltage is generated by the leak of the AC commercial voltage.

For example, the predetermined time T1 may be set to 5 times of the cycle of the AC commercial power. In this case, the zero-crossing count of the AC commercial power is 10. When the zero-crossing count of the measured earth voltage is 10, it may be determined that the earth voltage contains more value of 60 Hz component, and the measured earth voltage is generated by the leak of the AC commercial voltage. On the contrary, when the zero-crossing count of the measured earth voltage exceeds 10, it may be determined that the earth voltage contains more frequency components more significant than 60 Hz, and this is the earth voltage generated by the influence of the harmonics or by the parasitic voltage.

Further, as described above, referring back to FIG. 7, the measured earth voltage is similar to the 60 Hz waveform, which is the power frequency. However, since the content rate is less than the predetermined content rate (for example, 85%), it may be determined that the earth voltage is generated by not the leak but the parasitic voltage. Referring back to FIG. 8, in the case of the measured earth voltage, the content rate exceeds the predetermined content rate (e.g., 85%), but the waveform is not similar to the waveform of 60 Hz which is the power frequency, and the zero-crossing count of the AC commercial power exceeds the zero-crossing count of the earth voltage for the predetermined time T1 to determine that the corresponding voltage is the earth voltage generated by not by the leak, but raised by the influence of the harmonics or the parasitic voltage.

The method for determining that the earth voltage is generated by the leak of the AC commercial voltage based on the zero-crossing count is just an example, and the present disclosure is not limited thereto.

The leak detecting device 1000 may estimate the distortion count, which is the number of times the distortion by the harmonics occurs in the measured earth voltage for the predetermined time T1 (S1108). Here, the predetermined time T1 may be a time which is a predetermined integer multiple of a cycle of the AC commercial power.

A specific method of estimating the number of distortions by the leak detecting device 1000 will be described with reference to FIGS. 31 and 32.

FIG. 31 illustrates an example for describing a method for calculating the number of distortion times according to another embodiment of the present disclosure.

Referring to FIG. 31, when the polarity of a first change amount of a digital value of first earth voltage converted through sampling and a digital value of second earth voltage converted through sampling after a next sampling period and the polarity of a second change amount of a digital value of the second earth voltage and a digital value of third earth voltage converted through sampling after a next sampling period are different from each other, the leak detecting device 1000 determines that the distortion by the harmonics occurs to estimate the distortion count. For example, when the digital value of the first earth voltage is 50 mV and the digital value of the second earth voltage sampled next is 53 mV, the first change amount as (+)3 mV has a positive polarity. When the digital value of the third earth voltage sampled next is 52 mV, the second change amount as (−) 1 mV has a negative polarity. In this case, the polarity of the first change amount and the polarity of the second change amount are different from each other, and it may be determined that the distortion by the harmonics occurs and the distortion count may be estimated.

FIG. 32 is a flowchart for the method for calculating the number of distortion times according to another embodiment of the present disclosure.

Referring to FIG. 32, when the polarity of the first change amount is different from the polarity of the second change amount, the leak detecting device 1000 may estimate one time as the distortion count. When the total distortion count estimated for the predetermined time T1 is less than a predetermined distortion count, it is determined that the harmonics fewer influences the measured earth voltage. When it is determined that the harmonics fewer influences the measured earth voltage, accuracy and reliability may be increased, which may determine that the earth voltage is generated by the leak of the AC commercial power by calculating the effective value, the content rate, and the zero-crossing count based on the measured earth voltage.

The leak detecting device 1000 may determine that the earth voltage is generated by the leak of the AC commercial power based on at least any one of the effective value of the earth voltage, the voltage content rate, the total harmonic distortion, the harmonic distortion factor, the zero-crossing count, and the distortion count and determine a region where the earth voltage is measured as the suspicious earth leaking area based on the determination result.

The leak detecting device 1000 determines whether the effective value of the earth voltage exceeds a predetermined threshold voltage value (S1109).

When the effective value of the earth voltage exceeds the predetermined threshold voltage value, the leak detecting device 1000 determines whether the voltage content rate exceeds a predetermined voltage content rate (S1110).

When the voltage content rate exceeds the predetermined voltage content rate, the leak detecting device 1000 determines whether the total harmonic distortion is less than a predetermined total harmonic distortion (S1111).

When the total harmonic distortion is less than the predetermined total harmonic distortion, the leak detecting device 1000 determines whether the harmonic distortion factor is less than a predetermined harmonic distortion factor (S1112).

When the harmonic distortion factor is less than the predetermined harmonic distortion factor, the leak detecting device 1000 determines whether the zero-crossing count coincides with a predetermined count (S1113).

When the zero-crossing count coincides with the predetermined count, the leak detecting device 1000 determines whether the distortion count is less than a predetermined count (S1114).

When the distortion count is less than the predetermined count, the leak detecting device 1000 determines that the earth voltage is generated by the leak of the AC commercial power (S1115).

The method for determining the suspicious earth leaking area is just an example, and the present disclosure is not limited thereto.

Figure 36:
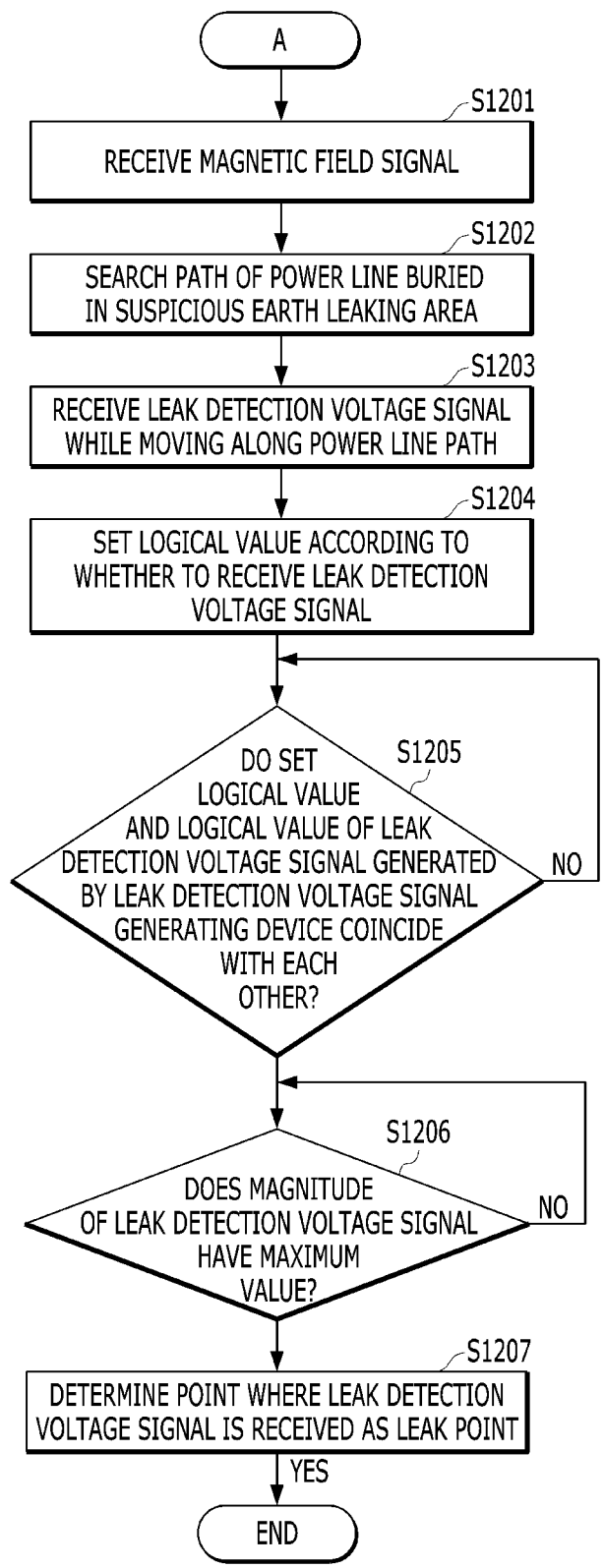
FIG. 36 is a flowchart for a method for determining a leak point according to another embodiment of the present disclosure.

FIG. 36 is a flowchart for a method for determining a leak point according to another embodiment of the present disclosure.

When it is determined that the earth voltage measured in the power line PEN is generated by the leak of the AC commercial power, the leak detecting device, 1000 may determine a point where the leak occurs in the power line along a path of the power line buried in the ground of the power line PEN where the earth voltage is measured as the leak point.

First, the leak detecting device 1000 may receive the magnetic field signal generated from the exploration current generating device (S1201).

As described above, the exploration current generating device injects the current signal into the power line and the neutral line within the suspicious earth leaking area and the leak detecting device 1000 may receive the magnetic field signal generated by exploration current which flows on the power line and the neutral line on the ground.

The leak detecting device 1000 may search the path of the power line buried in the suspicious earth leaking area based on the received magnetic field signal (S1202).

For example, the leak detecting device 1000 may determine a point where the magnitude of the magnetic field signal is the maximum point as a buried power line path. Further, the leak detecting device 1000 may search a direction of a path in which the power line is buried based on the magnetic field signal polarity.

First, the leak detecting device 1000 may receive the leak detection voltage signal generated from the leak detection voltage signal generating device (S1203).

As described above, the leak detection voltage signal generating device transmits the leak detection voltage signal, which is DC pulse voltage, to the power line. When the leak occurs in the power line, the AC commercial power includes the leak detection voltage signal to measure the earth voltage. The earth voltage measured by the leak detecting device 1000 also includes a harmonic component so that it is difficult to determine whether the pulse voltage component is the leak detection voltage signal or the harmonic component in the earth voltage. Therefore, the leak detection voltage signal generating device transmits the leak detection voltage signal after a predetermined time from the time when the exploration current generating device transmits the exploration current signal. Based on the time of receiving the magnetic field signal generated by the received exploration current, the leak detecting device 1000 may detect the pulse voltage component as the leak detection voltage signal in the earth voltage measured after a predetermined time.

First, the leak detecting device 1000 may set the logical value according to whether to receive the leak detection voltage signal (S1204).

The leak detecting device 1000 may determine whether the set logical value and the logical value of the leak detection voltage signal generated by the leak detection voltage signal generating device coincide with each other (S1205).

When the set logical value and the logical value of the leak detection voltage signal coincide with each other, the leak detecting device 1000 may determine a point where the magnitude of the leak detection voltage signal has the maximum value as the leak point (S1206).

When the magnitude of the leak detection voltage signal has the maximum value, the leak detecting device 1000 may determine a point where the leak detection voltage signal is received as the leak point (S1207).

It will be appreciated by those skilled in the art that information and signals may be expressed by using various predetermined technologies and techniques. For example, data, instructions, commands, information, signals, bits, symbols, and chips, which may be referred in the above description may be expressed by voltages, currents, electromagnetic waves, magnetic fields or particles, optical fields or particles, or predetermined combinations thereof.

It may be appreciated by those skilled in the art that various exemplary logical blocks, modules, processors, means, circuits, and algorithm steps described in association with the embodiments disclosed herein may be implemented by electronic hardware, various types of programs or design codes (for easy description, herein, designated as "software"), or a combination of all of them.

In order to clearly describe the inter compatibility of the hardware and the software, various exemplary components, blocks, modules, circuits, and steps have been generally described above in association with functions thereof. Whether the functions are implemented as the hardware or software depends on design restrictions given to a specific application and an entire system. Those skilled in the art of the present disclosure may implement functions described by various methods with respect to each specific application, but it should not be analyzed that the implementation determination departs from the scope of the present disclosure.

Further, various embodiments presented herein may be implemented as manufactured articles using a method, a device, or standard programming and/or engineering technique. The term "manufactured article" includes a computer program, a carrier, or a medium that is accessible by a predetermined computer-readable device. For example, a computer-readable medium includes a magnetic storage device (for example, a hard disk, a floppy disk, a magnetic strip, or the like), an optical disk (for example, a CD, a DVD, or the like), a smart card, and a flash memory device (for example, an EEPROM, a card, a stick, a key drive, or the like), but is not limited thereto. Further, various storage media presented herein include one or more devices and/or other machine-readable media for storing information. The term "machine-readable media" include a wireless channel and various other media that can store, possess, and/or transfer command(s) and/or data, but are not limited thereto.

It will be appreciated that a specific order or a hierarchical structure of steps in the presented processes is one example of exemplary accesses. It will be appreciated that the specific order or the hierarchical structure of the steps in the processes within the scope of the present disclosure may be rearranged based on design priorities. The appended method claims provide elements of various steps in a sample order, but it does not mean that the method claims are limited to the presented specific order or hierarchical structure.

The description of the presented embodiments is provided so that those skilled in the art of the present disclosure use or implement the present disclosure. Various modifications of the embodiments will be apparent to those skilled in the art, and general principles defined herein can be applied to other embodiments without departing from the scope of the present disclosure. Therefore, the present disclosure is not limited to the embodiments presented herein but should be analyzed within the widest range, which is consistent with the principles and new features presented herein.

The invention claimed is:

1. A device for detecting a leak, the device comprising:
   an earth voltage measuring unit measuring earth voltage;
   an ADC unit sampling the measured earth voltage and converting the sampled earth voltage into a digital value;
   an effective value calculating unit calculating an effective value of the earth voltage converted into the digital value;
   a Fourier transforming unit performing Fourier transform of the measured earth voltage to calculate voltage for each harmonic component which is an integer multiple of a fundamental frequency, based on the effective value of the earth voltage;
   a content rate calculating unit calculating a voltage content rate of the fundamental frequency to the voltage obtained by adding the voltage for each harmonic component based on the voltage for each harmonic component;
   a harmonic distortion rate calculating unit calculating a total harmonic distortion and a harmonic distortion factor based on the voltage value for each harmonic component;
   a zero-crossing estimating unit estimating a zero-crossing count at which the earth voltage converted into the digital value passes through zero voltage for a predetermined time T1; and
   a suspicious earth leaking area determining unit determining that the earth voltage is generated by the leak of the AC commercial power based on at least any one of the effective value of the earth voltage, the voltage content rate, the total harmonic distortion, the harmonic distortion factor, the zero-crossing count, and the distortion count and determining a region where the earth voltage is measured as the suspicious earth leaking area based on the determination result.

2. The device of claim 1, wherein the predetermined time T1 is a time which is a predetermined integer multiple of a cycle of the AC commercial power.

3. The device of claim 1, further comprising:
   a distortion estimating unit estimating the distortion count which is the number of times at which the distortion by the harmonics occurs in the measured earth voltage for the predetermined time T1,
   wherein the suspicious earth leaking area determining unit determines the suspicious earth leaking area based on at least any one of the effective value of the earth voltage, the voltage content rate, the total harmonic distortion, the harmonic distortion factor, the zero-crossing count, and the distortion count.

4. The device of claim 3, wherein when a polarity of a first change amount of a digital value of first earth voltage converted through sampling and a digital value of second earth voltage converted through sampling after a next sampling period and the polarity of a second change amount of a digital value of the second earth voltage and a digital value of third earth voltage converted through sampling after a next sampling period are different from each other, the distortion estimating unit determines that the distortion by the harmonics occurs to estimate the distortion count.

5. The device of claim 3, wherein the suspicious earth leaking area determining unit determines that the earth voltage is generated by the leak of the AC commercial power when the effective value of the earth voltage exceeds a predetermined threshold voltage value, the voltage content rate exceeds a predetermined voltage content rate, the total harmonic distortion is less than a predetermined total harmonic distortion, the harmonic distortion factor is less than a predetermined harmonic distortion factor, the zero-crossing count coincides with a predetermined count, and the distortion count is less than a predetermined count.

6. The device of claim 1, wherein the earth voltage measuring unit includes an electrode connected with a measurement point A which is a predetermined point on a ground surface,
an electrode connected with a measurement point B which is a predetermined point on the ground surface, which is different from the measurement point a,
a resistance array connected between the measurement point A and the measurement point B in parallel, and
a voltage measuring unit measuring voltage between both ends of the resistance array.

7. The device of claim 1, wherein the zero-crossing estimating unit estimates the zero-crossing count passing through the zero voltage when the polarity of the earth voltage is changed for the predetermined time T1.

8. The device of claim 1, wherein the suspicious earth leaking area determining unit determines that the earth voltage is generated by the leak of the AC commercial power when the effective value of the earth voltage exceeds a predetermined threshold voltage value, the voltage content rate exceeds a predetermined voltage content rate, the total harmonic distortion is less than a predetermined total harmonic distortion, the harmonic distortion factor is less than a predetermined harmonic distortion factor, and the zero-crossing count coincides with a predetermined count.

9. The device of claim 1, further comprising:
a magnetic field signal receiving unit receiving a magnetic field signal generated from an exploration current generating device;
a leak detection voltage signal receiving unit receiving a leak detection voltage signal generated from a leak detection voltage signal generating device;
a power line buried path search unit searching a path of a power line buried in the suspicious earth leaking area based on the magnetic field signal; and
a leak point determining unit determining a leak point of the buried power line based on the leak detection voltage signal.

10. The device of claim 9, wherein the leak point determining unit sets a logical value according to whether to receive the leak detection voltage signal and determines a point where the set logical value and a logical value of the leak detection voltage signal generated by the leak detection voltage signal generating device coincide with each other and the magnitude of the leak detection voltage signal has a maximum value as the leak point.

* * * * *